United States Patent
Sunohara et al.

(10) Patent No.: US 8,446,013 B2
(45) Date of Patent: May 21, 2013

(54) WIRING SUBSTRATE AND METHOD FOR MANUFACTURING THE WIRING SUBSTRATE

(75) Inventors: Masahiro Sunohara, Grenoble Cedex (FR); Takayuki Tokunaga, Nagano (JP); Hedeaki Sakaguchi, Nagano (JP); Akihito Takano, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 98 days.

(21) Appl. No.: 13/164,129

(22) Filed: Jun. 20, 2011

(65) Prior Publication Data

US 2011/0316169 A1 Dec. 29, 2011

(30) Foreign Application Priority Data

Jun. 24, 2010 (JP) .................................. 2010-143876
Apr. 20, 2011 (JP) .................................. 2011-094296

(51) Int. Cl.
H01L 23/48 (2006.01)

(52) U.S. Cl.
USPC ......................................................... 257/774

(58) Field of Classification Search
USPC ........................... 257/774, 775; 438/629, 637
See application file for complete search history.

(56) References Cited

U.S. PATENT DOCUMENTS

| | | | |
|---|---|---|---|
| 2004/0080052 A1* | 4/2004 | Ou et al. ........................ | 257/774 |
| 2004/0119166 A1 | 6/2004 | Sunohara | |
| 2005/0184397 A1* | 8/2005 | Gates et al. ................... | 257/774 |
| 2006/0097378 A1* | 5/2006 | Yamano ........................ | 257/698 |
| 2007/0170595 A1* | 7/2007 | Sinha ............................ | 257/774 |
| 2007/0176197 A1* | 8/2007 | Shiraishi et al. ............... | 257/99 |
| 2007/0176294 A1* | 8/2007 | Wada ............................ | 257/774 |
| 2008/0001299 A1* | 1/2008 | Morimoto ..................... | 257/774 |
| 2008/0023846 A1* | 1/2008 | Seki et al. ..................... | 257/774 |
| 2008/0036094 A1* | 2/2008 | Yoneda ......................... | 257/774 |
| 2008/0136038 A1* | 6/2008 | Savastiouk et al. ........... | 257/774 |
| 2008/0150140 A1* | 6/2008 | Furuya .......................... | 257/751 |
| 2009/0108411 A1 | 4/2009 | Shiraishi et al. | |
| 2009/0160064 A1* | 6/2009 | Jeong ............................ | 257/774 |
| 2009/0196001 A1* | 8/2009 | Sunohara et al. ............. | 361/781 |

FOREIGN PATENT DOCUMENTS

JP 2004-158537 6/2004

* cited by examiner

Primary Examiner — Nathan Ha
(74) Attorney, Agent, or Firm — IPUSA, PLLC

(57) ABSTRACT

A wiring substrate includes a substrate body including a first substrate surface and a second substrate surface, a trench being open toward the first substrate surface, the trench having an inner bottom surface and an inner side surface, a through-hole having a first end communicating with the inner bottom surface of the trench and a second end being open toward the second substrate surface, a first conductive layer having a first surface toward the trench and being filled inside at least a portion of the through-hole from the second end, a second conductive layer covering the first surface and at least a part of the inner bottom surface of the trench, and a third conductive layer covering the second conductive layer and being filled inside the trench.

18 Claims, 17 Drawing Sheets

WIRING SUBSTRATE AND METHOD FOR MANUFACTURING THE WIRING SUBSTRATE

CROSS-REFERENCE TO RELATED APPLICATIONS

This application is based upon and claims the benefit of priority of the prior Japanese Patent Application Nos. 2010-143876 and 2011-094296 filed on Jun. 24, 2010 and Apr. 20, 2011, respectively, the entire contents of which are incorporated herein by reference.

FIELD

The embodiments discussed herein are related to a wiring substrate including through-holes and a method for manufacturing the wiring substrate.

BACKGROUND

FIG. 1 is a cross-sectional view of a wiring substrate 100 according to a related art example. With reference to FIG. 1, the wiring substrate 100 includes a substrate body 110, a first insulation layer 120, a first conductive layer 130, a second conductive layer 140, a second insulation layer 150, a third insulation layer 160, a first external connection terminal 170, and a second external connection terminal 180.

In the wiring substrate 100, the substrate body 110 is used as a substrate for forming layers such as the first conductive layer 130 thereon. A trench 110x and a through-hole 110y communicating with the trench 110x are formed in the substrate body 110. The first insulation layer 120 is formed on the first and second surfaces 110a, 110b of the substrate body 110, an inner bottom plane and an inner side plane of the trench 110x, and an inner side plane of the through-hole 110y.

The first conductive layer 130 is formed on the first insulation layer 120 that covers the inner bottom surface and the inner side surface of the trench 110x and the inner side surface of the through-hole 110y. The second conductive layer 140 is formed on the first conductive layer 130 fills the inside of the trench 110x and the through-hole 110y. The first conductive layer 130 is electrically connected to the second conductive layer 140.

The second insulation layer 150 is formed on the first insulation layer 120 (covering the first surface 110a of the substrate body 110) and on portions of the first and second conductive layers 130, 140. The second insulation layer 150 includes an opening part 150x. A portion of the second conductive layer 140 is exposed at a bottom part of the opening part 150x.

The third insulation layer 160 is formed on the first insulation layer 120 (covering the second surface 110b of the substrate body 110) and on portions of the first and second conductive layers 130, 140. The third insulation layer 160 includes an opening part 160x. A portion of the second conductive layer 140 is exposed at a bottom part of the opening part 160x.

The external connection terminal 170 is formed on the second conductive layer 140 having a portion exposed at the bottom part of the opening part 150x. The first external connection terminal 170 is electrically connected to the second conductive layer 140. The second external connection terminal 180 is formed on the second conductive layer 140 having a portion exposed at the bottom part of the opening part 160x. The second external connection terminal 180 is electrically connected to the second conductive layer 140.

FIGS. 2 through 4 illustrate processes for manufacturing a wiring substrate according to a related art example. First, the trench 110x and the through-hole 110y communicating with the trench 110x are formed in the substrate body 110. Then, the first insulation layer 120 is formed on the first surface 110a of the substrate body 110, the inner bottom surface and the inner side surface of the trench 110x, and the inner side surface of the through-hole 110y. Then, a first conductive layer 130S is formed on the first insulation layer 120 covering the first surface 110a of the substrate body 110, the inner bottom surface and the inner side surface of the trench 110x, and the inner side surface of the through-hole 110y. The first conductive layer 130S is formed by using, for example, a sputtering method. As described below, the first conductive layer 130S is subsequently formed into the first conductive layer 130 after unnecessary portions are removed therefrom.

Then, in the process illustrated in FIG. 3, a copper plate 220 is mounted on the first insulation layer 120 (covering the second surface 110b of the substrate body 110) via an adhesive layer 210. The adhesive layer 210 includes an opening part 210x that is formed in correspondence with the through-hole 110y. Then, a second conductive layer 140S fills the inside of the trench 110x and the through-hole 110y and covers the first conductive layer 130S. The second conductive layer 140S is formed by using, for example, an electroplating method where the copper plate 220 and the first conductive layer 130S are used as a feeding layer. As described below, the second conductive layer 140S is subsequently formed into the second conductive layer 140 after unnecessary portions are removed therefrom.

Then, in the process illustrated in FIG. 4, the second conductive layer 140S formed on the first surface 110a of the substrate body 110 is polished by using, for example, a CMP (Chemical Mechanical Polishing) method. Thereby, the second conductive layer 140 is formed along with exposing the first conductive layer 130S on the first surface 110a of the substrate body 110. Then, exposed portions of the first conductive layer 130S are removed by using, for example, an etching method. Thereby, the first conductive layer 130 is formed. Then, the conductive layer 210 and the copper plate 220 illustrated in FIG. 3 are removed.

Then, the second insulation layer 150, the third insulation layer 160, the first external connection terminal 170, and the second external connection terminal 180 are formed in the configuration illustrated in FIG. 4 by using known methods. Thereby, the manufacturing of the wiring substrate 100 illustrated in FIG. 1 is completed.

As described above, the second conductive layer 140S is formed by using an electroplating method where the copper plate 220 and the first conductive layer 130S are used as a feeding layer. In this process of forming the second conductive layer 140S, a plating film simultaneously grows from the first conductive layer 130S at the inner side surface of the trench 110x and from the first conductive layer 130S at the inner bottom surface of the trench 110x. Further, a plating film simultaneously grows from the first conductive layer 130S at the inner side surface of the through-hole 110y and from a portion of the copper plate 220 corresponding to the through-hole 110y.

Accordingly, in the second conductive layer 140S formed in the trench 110x, defects (e.g., seams, voids) may be formed at the joining portions among the plating films growing from multiple directions. Further, in the second conductive layer 140S formed in the through-hole 110y, defects (e.g., seams, voids) may also be formed at the joining portions among the plating films growing from multiple directions. Such defects (e.g., seams, voids) tend to be formed particularly where the aspect ratio of the trench 110x or the through-hole 110y becomes large. In a case where such defects (e.g., seams, voids) are formed in the second conductive layer 140S, thermal stress may cause disconnection at the second conductive layer or degrading of connecting reliability with respect to the first external connection terminal 170 or the second external connection terminal 180.

SUMMARY

According to an aspect of the invention, there is provided a wiring substrate including a substrate body including a first substrate surface and a second substrate surface, a trench being open toward the first substrate surface, the trench having an inner bottom surface and an inner side surface, a through-hole having a first end communicating with the inner bottom surface of the trench and a second end being open toward the second substrate surface, a first conductive layer having a first surface toward the trench and being filled inside at least a portion of the through-hole from the second end, a second conductive layer covering the first surface and at least a part of the inner bottom surface of the trench, and a third conductive layer covering the second conductive layer and being filled inside the trench.

The object and advantages of the invention will be realized and attained by means of the elements and combinations particularly pointed out in the claims.

It is to be understood that both the foregoing generation description and the following detailed description are exemplary and explanatory and are not restrictive of the invention, as claimed.

DESCRIPTION OF EMBODIMENTS

In the following, embodiments of the present invention are described with reference to the accompanying drawings.

First Embodiment

Configuration of Wiring Substrate According to First Embodiment

Figure 1:
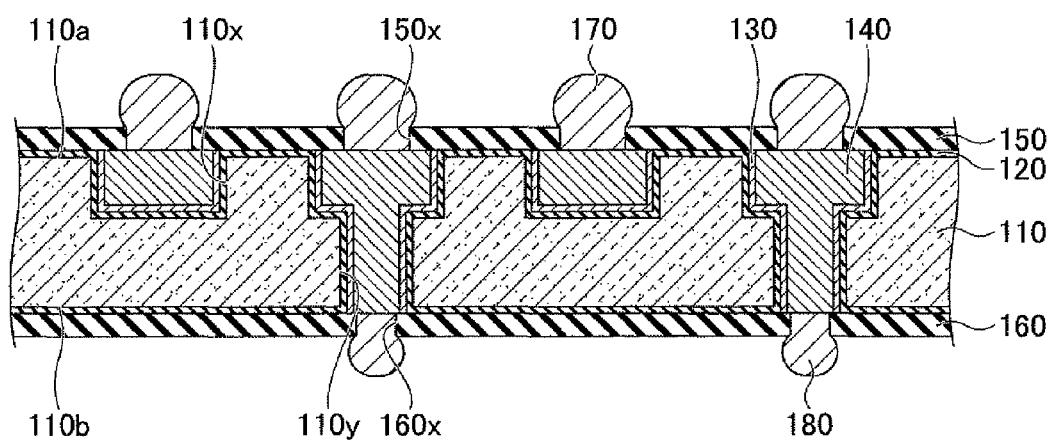
FIG. 1 is a cross-sectional view of a wiring substrate according to a related art example.
Figure 2:
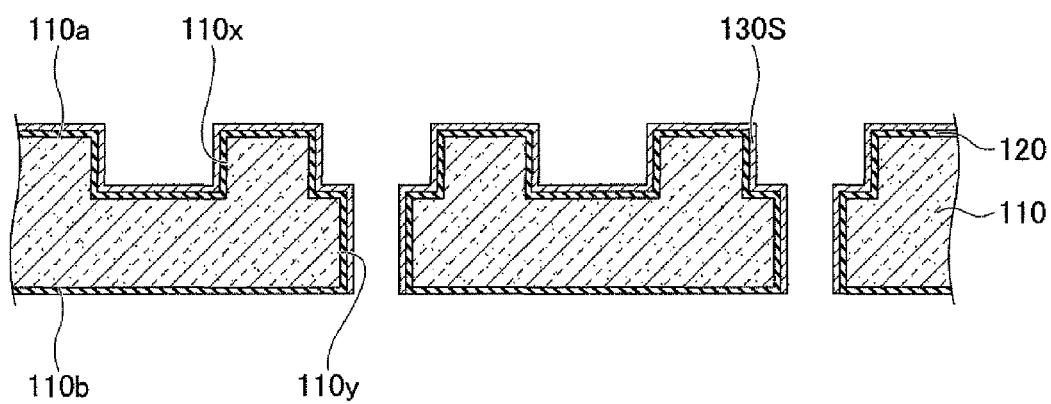
FIGS. 2-4 are schematic diagrams illustrating processes of a wiring substrate manufacturing method according to a related art example (parts 1-3)
Figure 3:
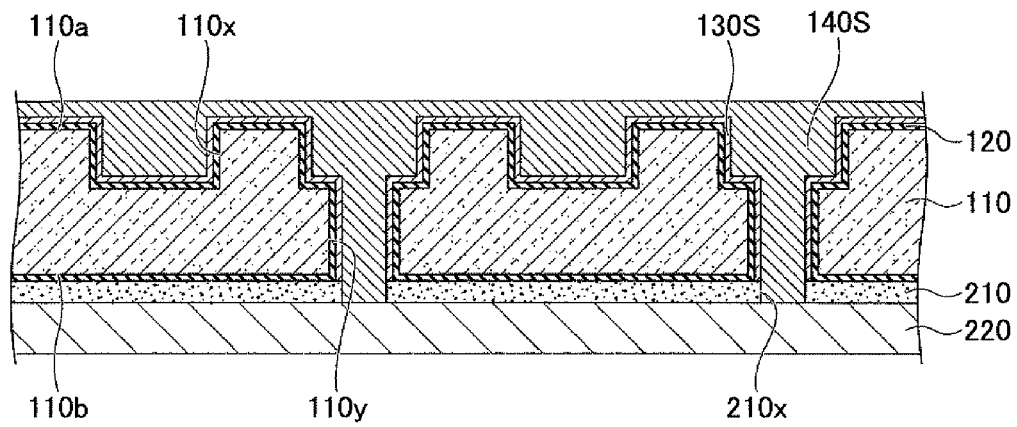
Figure 4:
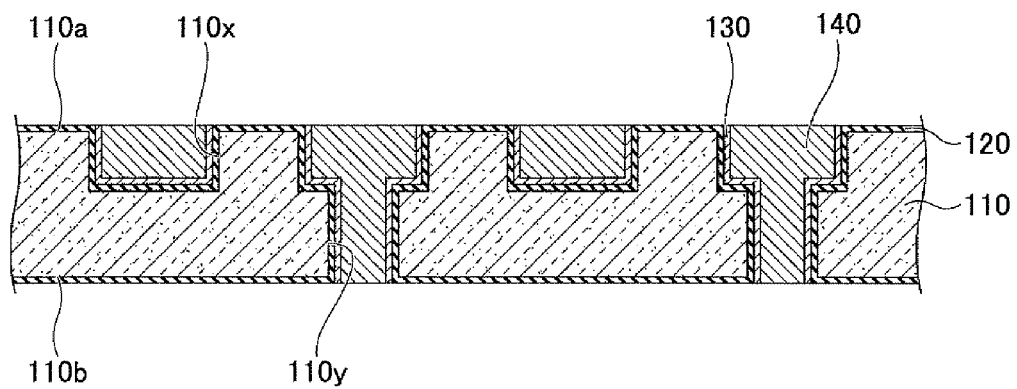
Figure 5:
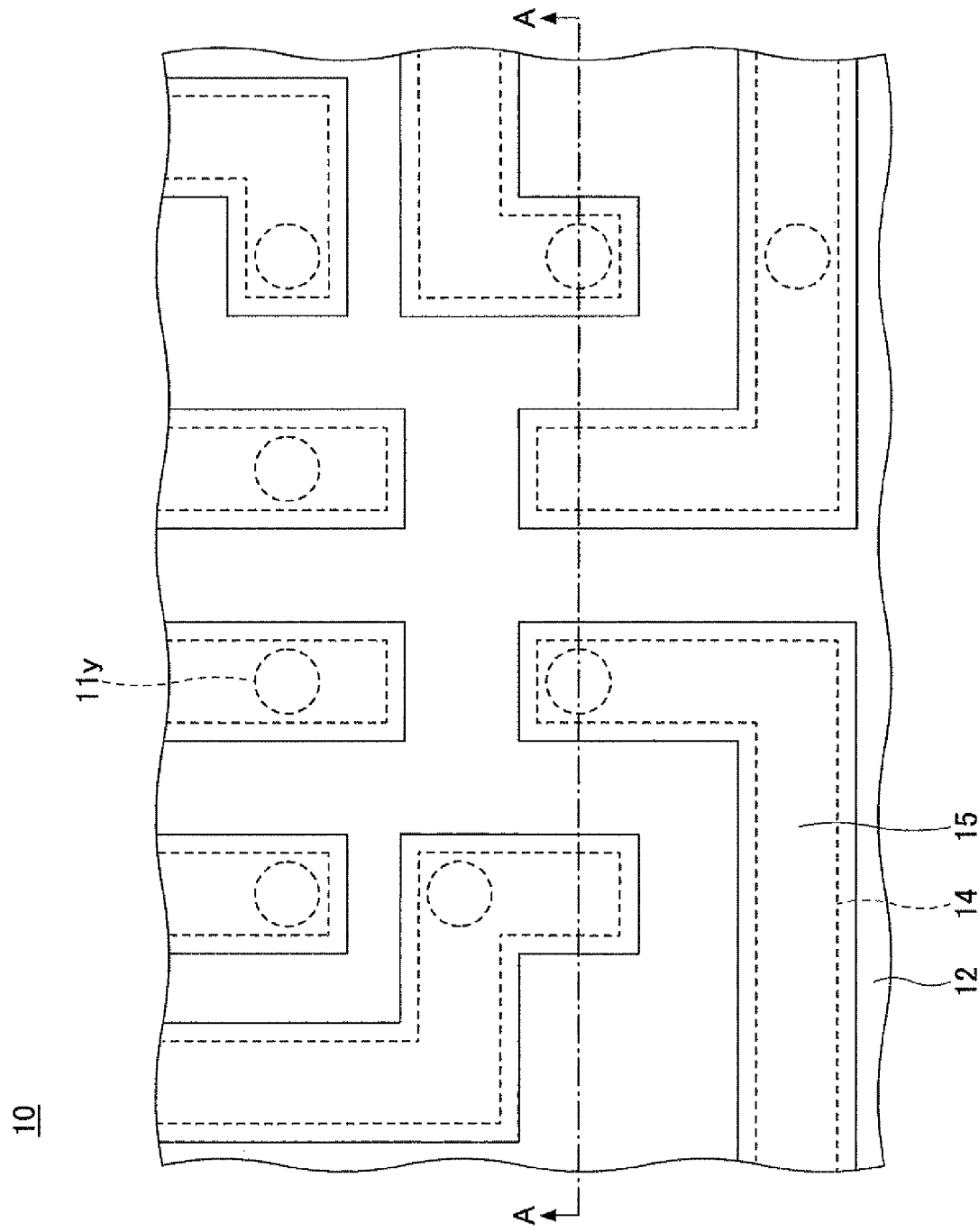
FIG. 5 is a plan view illustrating a wiring substrate according to a first embodiment of the present invention.
Figure 6:
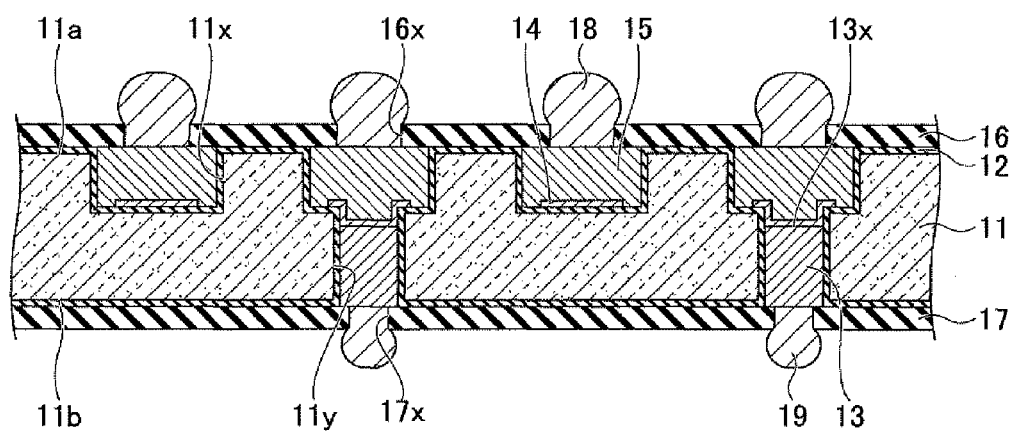
FIG. 6 is a cross-sectional view of the wiring substrate taken along line A-A of FIG. 5.

First, a configuration of a wiring substrate 10 according to a first embodiment of the present invention is described. FIG. 5 is a plan view illustrating the wiring substrate 10 according to the first embodiment. FIG. 6 is a cross-sectional view of the wiring substrate 10 taken along line A-A of FIG. 5.

With reference to FIGS. 5 and 6, the wiring substrate 10 includes, for example, a substrate body 11, a first insulation layer 12, a first conductive layer 13, a second conductive layer 14, a third conductive layer 15, a second insulation layer 16, a third insulation layer 17, a first external connection terminal 18, and a second external connection terminal 19. It is to be noted that, the second insulation layer 16 and the first external connection terminal 18, which are illustrated in FIG. 6, are omitted from FIG. 5 for the sake of convenience.

In the wiring substrate 10, the substrate body 11 is used as a substrate for forming layers such as the first conductive layer 13 thereon. One or more trenches 11x and through-holes 11y are formed in the substrate body 11. The thickness of the substrate body 11 may be, for example, approximately 200 μm-400 μm. The material of the substrate body 11 may be, for example, silicon, glass, or ceramic.

The wiring substrate 10 can become a semiconductor package by mounting a semiconductor chip on the wiring substrate 10. In the case of mounting the semiconductor chip, consistency between the thermal expansion coefficient of the substrate body 11 and the thermal expansion coefficient of the semiconductor chip is to be considered. Thus, from the aspect of attaining consistency of thermal expansion coefficient, silicon or borosilicate glass having a thermal expansion coefficient similar to that of silicon is preferred as the material of the substrate body 11 considering that many semiconductor chips include a silicon substrate. The borosilicate glass is a glass material that mainly includes boric acid ($B_2O_3$) and silicic acid ($SiO_2$) and has a thermal expansion coefficient of approximately 3 ppm/° C. Further, from the aspect of processing, silicon is preferred as the material of the substrate body 11.

The consistency between the thermal expansion coefficient of the substrate body 11 and the thermal expansion coefficient of the semiconductor chip is to be attained for reducing the thermal stress that occurs at a bonding portion between the wiring substrate 10 and the semiconductor chip, for example, in a high temperature environment or in a low temperature environment. The following embodiment of the substrate body 11 is described with an example where silicon is used as the material of the substrate body 11.

The trench 11x is open toward a first surface 11a of the substrate body 11 and has a cross section having a substantially rectangular shape. The trench 11x is a portion of the substrate body 11 where a wiring pattern including the third conductive layer 15 is formed. Accordingly, the trench 11x is formed in an area (position) corresponding to the shape of the wiring pattern (see, for example, FIG. 5). The width of the trench 11x may be, for example, approximately 50 μm-70 μm. The depth of the trench 11x may be, for example, approximately 40 μm-60 μm. The pitch between the trenches 11x may be, for example, approximately 80 μm-100 μm.

The through-hole 11y is open toward a second surface 11b (i.e. opposite side of first surface 11a) of the substrate body 11 and has a plan-view having a substantially circle shape (so-called "TSV (Through Silicon Via)"). One end of the through-hole 11y is in communication with the trench 11x. The through-hole 11y is a portion of the substrate body 11 where the first conductive layer 13 is formed. The diameter of the through-hole 11y may be, for example, approximately 40 μm-60 μm. The depth of the through-hole 11y may be, for example, approximately 140 μm-360 μm. Thus, the through-hole 11y of this embodiment has a relatively high aspect ratio. Although the trench 11x may not seem to be in communication with the through-hole 11y according to the cross-sectional view of FIG. 6, the trench 11x is in communication with the through-hole 11y at a portion not illustrated in the cross-sectional view of FIG. 6 (see, for example, FIG. 5).

The first insulation layer 12 is formed on the first and second surfaces 11a, 11b of the substrate body 11, the inner bottom surface and the inner side surface of the trench 11x, and the inner side surface of the through-hole 11y. The first insulation layer 12 is providing insulation between the substrate body 11 and the first conductive layer 13 and between the second conductive layer 14 and the third conductive layer 15. The material of the first insulation layer 12 may be, for example, silicon dioxide (SiO$_2$), silicon nitride (SiN), or polyimide (PI). The thickness of the first insulation layer 12 may be, for example, 1 μm-2 μm. In this embodiment, the first insulation layer 12 is used because the substrate body 11 is formed of silicon (semiconductor material). Alternatively, in a case where the substrate body 11 is formed of an insulation material (e.g., glass), the first insulation layer 12 need not to be formed.

The first conductive layer 13 fills at least a portion of the through-hole 11y covered by the first insulation layer 12. In this embodiment, the inside of the through-hole 11y is filled with the first conductive layer 13 except for an upper part (toward the trench 11x) of the through-hole 11y. Thereby, the inside of the through-hole 11y may be filled with the first conductive layer 13 to a point where an upper surface of the first conductive layer 13 (surface toward the trench 11x) is located at a bottom of a concave that is recessed toward the second surface 11b of the substrate body 11 with respect to an inner bottom surface of the trench 11x. In other words, a concave part 13x is formed by the upper surface of the first conductive layer 13 (surface toward the trench 11x) and the part of the first insulation layer 12 covering the inner side surface of the through-hole 11y.

It is to be noted that the first conductive layer 13 may completely fill the inside of the through-hole 11y including the upper part of the through-hole 11y. In the case where the inside of the through-hole 11y is completely filled by the first conductive layer 13, the upper surface of the first conductive layer 13 (surface toward the trench 11x) becomes substantially flush with a part of the upper surface of the first insulation layer 12 covering the inner bottom surface of the trench 11x. Thus, in this case where the upper surface of the first conductive layer 13 and the part of the upper surface of the first insulation layer 12 covering the inner bottom surface of the trench 11x are substantially flush, the concave part 13x is not formed. The depth of the concave part 13x may be, for example, approximately 0 μm-10 μm.

The first conductive layer 13 should be prevented from projecting from the inner bottom surface of the trench 11x. This is because the second conductive layer 14, which covers the first conductive layer 13 including the projecting part, is unable to maintain a sufficient covering state in the case where the first conductive layer 13 includes the projecting part. Thus, such projecting part may lead to problems such as peeling or disconnection of the second conductive layer 14. In order to prevent such problems from occurring, the inside of the through-hole 11y according to this embodiment is filled with the first conductive film 13 to a point where the upper surface of the first conductive layer 13 (surface toward the trench 11x) is located at a bottom of a concave that is recessed toward the second surface 11b of the substrate body 11 with respect to an inner bottom surface of the trench 11x.

The material of the first conductive layer 13 may be, for example, copper (Cu). The first conductive layer 13 is used as an electrode that electrically connects a wiring pattern including the third conductive layer 15 to the first external connection terminal 18 via the second conductive layer 14.

The second conductive layer 14 is formed inside the concave part 13x and a part of the trench 11x. More specifically, the second conductive layer 14 covers the upper surface of the first conductive layer 13 (surface of the first conductive layer 13 toward the trench 11x) and a part of the first insulation layer 12 covering the inner bottom surface of the trench 11x except for an outer edge part of the inner bottom surface part 11x. That is, the second conductive layer 14 is not formed on the part of the first insulation layer 12 covering the outer edge part of the inner bottom surface of the trench 11x. Thereby, gaps (spaces) of substantially constant width are formed between the first insulation layer 12 covering the inner side surface of the trench 11x and the second conductive layer 14 formed on a part of the bottom surface of the trench 11x via the first insulation layer 12. The gaps may be, for example, approximately a few μm. The second conductive layer 14 is electrically connected to the first conductive layer 13 and the third conductive layer 15.

The second conductive layer 14 may have a stacked configuration including a titanium (Ti) film and a copper (Cu) film that are stacked on the first conductive layer 13 or the first insulation layer 12 in this order. In a case where the material of the titanium (Ti) film is silicon dioxide (SiO$_2$) or silicon nitride (SiN), firm adhesiveness can be attained. The thickness of the second conductive layer 14 may be, for example, approximately 1 μm.

The third conductive layer 15 covers the second conductive layer 14 and fills the inside of the trench 11x. The upper surface of the third conductive layer 15 is substantially flush with the upper surface of the first insulation layer 12 covering the first surface 11a of the substrate body 11. The material of the third conductive layer 15 may be, for example, copper (Cu). The third conductive layer 15 forms a wiring pattern. In a case where the material of the third conductive layer 15 is copper (Cu) and the material of the first insulation layer 12 is silicon dioxide (SiO$_2$) or silicon nitride (SiN), the third conductive layer 15 and the first insulation layer 12 do not adhere with each other. However, because the third conductive layer 15 adheres to the first insulation layer 12 or the first conductive layer 13 via the second conductive layer 14, adhesive strength of the third conductive layer 15 would not be a problem.

According to the above-described embodiment, the second conductive layer 14 is always interposed between the first conductive layer 13 and the third conductive layer 15. This owes to the below-described process for manufacturing the wiring substrate 10. With the below-described process of manufacturing the wiring substrate 10, defects such as seams and voids can be prevented from occurring.

The second insulation layer 16 is formed on the first insulation layer 12 covering the first surface 11a of the substrate body 11 and the third conductive layer 15. The second insulation layer 16 includes an opening part 16x. A portion of third conductive layer 15 is exposed at a bottom of the opening part 16x. The exposed portion of the third conductive layer 15 functions as an electrode pad on which the first external connection terminal 18 is formed. The material of the second insulation layer 16 may be, for example, an insulation resin material such as benzocyclobutene (BCN), polybenzoxazole (PBO), or polyimide (PI). The material of the second insulation layer 16 may be, for example, a photosensitive resin composition including epoxy resin or imide resin. The thickness of the second insulation resin 16 may be, for example, approximately 5 μm-30 μm.

A metal layer may be formed on the third conductive layer 15 exposed at the bottom of the opening part 16x according to necessity. The metal layer may be, for example, a gold (Au) layer, a nickel (Ni)/gold (Au) layer (i.e. a metal layer having a nickel layer and a gold layer stacked in this order), or a nickel/palladium/gold layer (i.e. a metal layer having a nickel layer, a palladium layer, and a gold layer stacked in this order). Alternatively, the metal layer may be, for example, a solder plating layer such as a tin-silver (Sn—Ag) plating or a tin-silver-copper (Sn—Ag—Cu) plating. By forming the metal layer, the connecting reliability between, for example, the third conductive layer 15 and the first external connection terminal 18 can be improved.

The third insulation layer 17 is formed on the first insulation layer 12 covering the second surface 11b of the substrate body 11 and the first conductive layer 13. The third insulation layer 17 includes an opening part 17x. A portion of the first conductive layer 13 is exposed at a bottom of the opening part 17x. The exposed portion of the first conductive layer 13 functions as an electrode pad on which the second external connection terminal 19 is formed. Because the material and thickness of the third insulation layer 17 are the same as those of the second insulation layer 16, description thereof is omitted.

A metal layer may be formed on the first conductive layer 13 exposed at the bottom of the opening part 17x and the conductive layer 15 exposed at the bottom of the opening part 16x according to necessity. By forming the metal layer, the connecting reliability between, for example, the first conductive layer 13 and the second external connection terminal 19 can be improved.

The first external connection terminal 18 is formed on the third conductive layer 15 exposed at the bottom of the opening part 16x. Alternatively, in the case of forming a metal layer on the third conductive layer 15 exposed at the bottom of the opening part 16x, the first external connection terminal 18 is formed on the metal layer. The second external connection terminal 19 is formed on the first conductive layer 13 exposed at the bottom of the opening part 17x. Alternatively, in the case of forming a metal layer on the first conductive layer 13 exposed at the bottom of the opening part 17x, the second external connection terminal 19 is formed on the metal layer.

The first and second external connection terminals 18, 19 are terminals for electrically connecting the wiring substrate 10 with, for example, a semiconductor chip or other wiring substrates. For example, solder bumps may be used as the first and second external connection terminals 18, 19. In a case where the first and second external connection terminals 18, 19 are solder bumps, the material of the solder bumps may be, an alloy containing lead (Pb), an alloy containing tin (Sn) and copper (Cu), an alloy containing tin (Sn) and silver (Ag), or an alloy containing tin (Sn), silver (Ag), and copper (Cu).

It is, however, to be noted that the first and second external connection terminals 18, 19 do not always need to be formed in the wiring substrate 10. For example, the third conductive layer 15 exposed at the bottom of the opening part 16x and the first conductive layer 13 exposed at the bottom of the opening part 17x may be used as the first and second external connection terminals. In such case, the wiring substrate 10 is connected to a semiconductor chip or bumps/pins of another wiring substrate via the third conductive layer 15 exposed at the bottom of the opening part 16x and the first conductive layer 13 exposed at the bottom of the opening part 17x.

Plural wiring layers and plural insulation layers being alternately stacked one on top of the other may further be formed on the second insulation layer 12 and/or the third insulation layer 17, to thereby form a multilayer wiring structure.

Method for Manufacturing Wiring Substrate According to First Embodiment

Next, a method for manufacturing a wiring substrate according to a first embodiment of the present invention is described. FIGS. 7-20 are schematic diagrams illustrating processes of a wiring substrate manufacturing method according to the first embodiment of the present invention.

Figure 7:
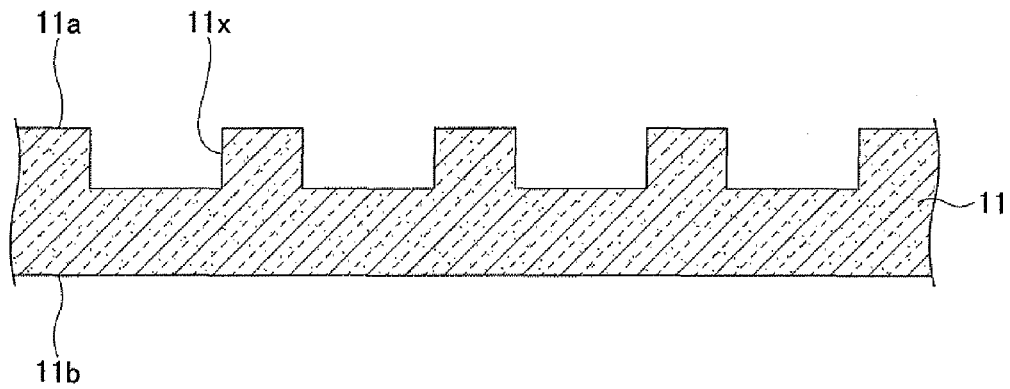
FIGS. 7-20 are schematic diagrams illustrating processes of a wiring substrate manufacturing method according to the first embodiment of the present invention (parts 1-14)

First, in the process illustrated in FIG. 7, the substrate body 11 is prepared. Then, the trenches 11x are formed in the substrate body 11. The trenches 11x are open toward the first surface 11a of the substrate body 11. The trenches 11x are formed in areas of the substrate body 11 at which a wiring pattern including the third conductive layer 15 is formed. Therefore, the trenches fix are formed in correspondence with the shape of the wiring pattern. The wiring substrate 11 may be a silicon wafer having a length of, for example, 6 inches (approximately 150 mm), 8 inches (approximately 200 mm), or 12 inches (approximately 300 mm). The thickness of the silicon wafer may be, for example, 0.625 mm (in the case of a 6 inch silicon wafer), 0.725 mm (in the case of an 8 inch silicon wafer), or 0.775 mm (in the case of a 12 inch silicon wafer). The thickness of the silicon wafer may, however, be further reduced by using, for example, a backside grinder.

The trenches 11x may be formed by forming a resist layer on the first surface 11a of the substrate body 11 and etching corresponding areas of the substrate body 11 by using the resist layer as a mask. One suitable etching method is, for example, an anisotropic etching method such as a DRIE (Deep Reactive Ion Etching) method using $SF_6$ (sulfur hexafluoride). The width of the trenches 11x may be, for example, approximately 50 μm-70 μm. The depth of the trenches 11x may be, for example, approximately 40 μm-60 μm. The pitch between the trenches 11x may be, for example, approximately 80 μm-100 μm.

Figure 8:
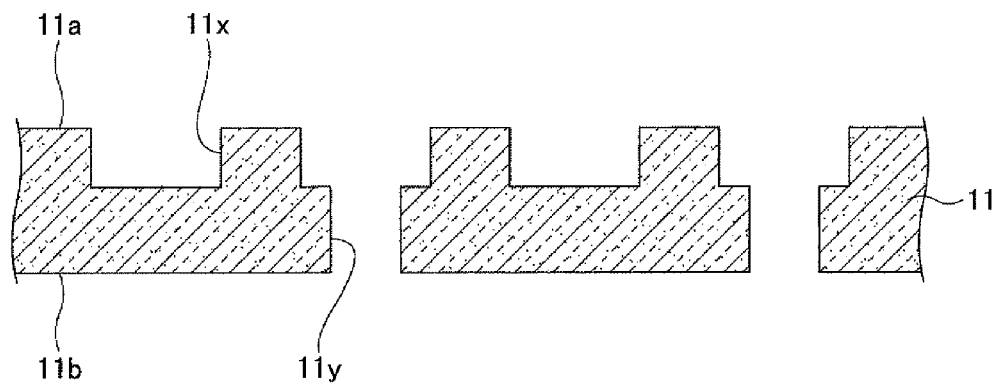

Then, in the process illustrated in FIG. 8, the through-holes 11y are formed. The through-holes 11y are formed having one end communicating with the trenches 11x and the other end opened toward the second surface 11b of the substrate body 11. Because the through-holes 11y are formed in the same manner as the trenches 11x, detailed description of the forming of the through-holes 11y is omitted. The plan shape of the through-holes 11y may be a substantially circle shape. The diameter of the through-holes 11y may be, for example, approximately 40 μm-60 μm. The depth of the through-holes 11y may be, for example, approximately 140 μm-360 μm. A process of forming a thermal oxide film ($SiO_2$) may be performed between the process of forming the trenches 11x in FIG. 7 and the process of forming the through-holes 11y in FIG. 8. The thermal oxide film covers the first surface 11a of the substrate body 11 and the inner bottom surface and the inner side surface of the trenches 11x.

Figure 9:
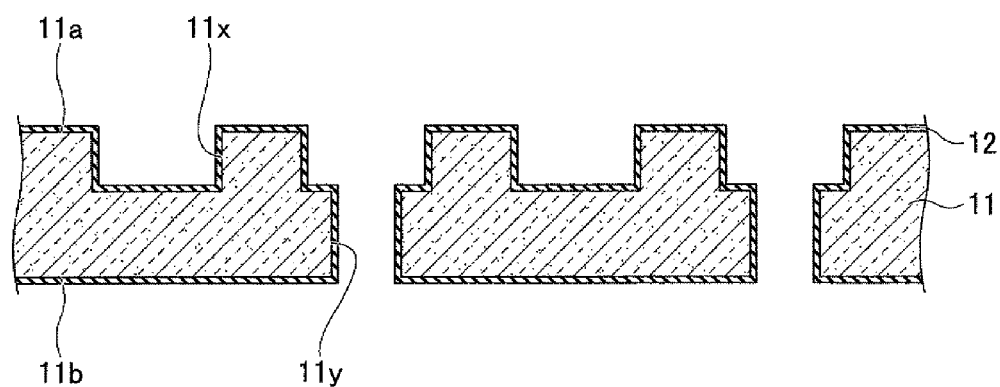

Then, in the process illustrated in FIG. 9, the first insulation layer 12 is formed. The first insulation layer 12 is formed on the first and second surfaces 11a, 11b of the substrate body 11, the inner bottom surface and the inner side surface of the trenches 11x, and the inner side surface of the through-holes 11y. A thermal oxide film (e.g., SiO$_2$) may be used as the first insulation layer 12. The first insulation layer 12 may be formed by using a wet thermal oxidation method where thermal oxidation is performed on the vicinity of the surface of the substrate body 11 at a temperature of, for example, 1000° C. or more. The thickness of the first insulation layer 12 may be, for example, approximately 1 μm-2 μm. Alternatively, the first insulation layer 12 may be formed as a layer including, for example, silicon dioxide (SiO$_2$), silicon nitride (SiN) or polyimide (PI) by using a CVD (Chemical Vapor Deposition) method. In the case where a process of forming a thermal oxide film (SiO$_2$) is performed between the process of forming the trenches 11x in FIG. 7 and the process of forming the through-holes 11y in FIG. 8, the thermal oxide film (SiO$_2$) is removed before performing the process illustrated in FIG. 9. After the thermal oxide film (SiO$_2$) is removed, the first insulation layer 12 is formed as illustrated in FIG. 9.

Figure 10:
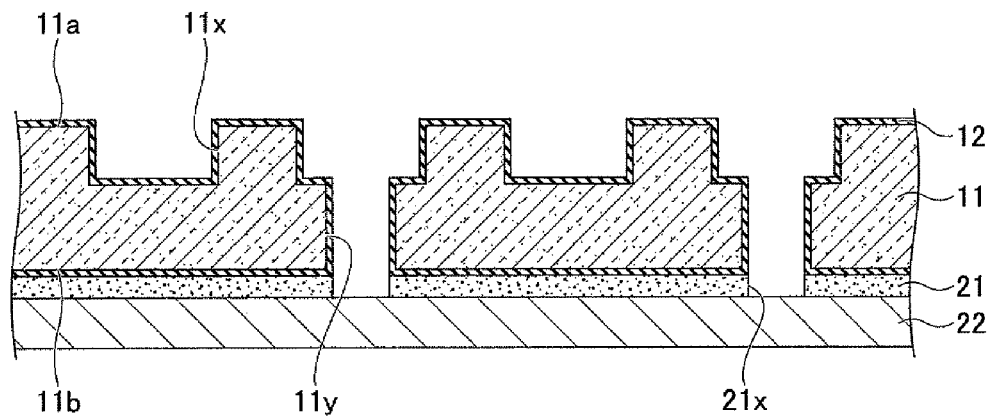

Then, in the process illustrated in FIG. 10, a metal layer 22 is provided on a portion of the first insulation layer 12 covering the second surface 11b of the substrate body 11 via an adhesive layer 21. Then, portions of the adhesive layer 21 corresponding to the positions of the through-holes 11y are removed by using, for example, an ashing method. By removing the portions of the adhesive layer 21, opening parts 21x are formed. Thereby, an upper surface of the metal layer 22 is exposed at the bottom of the through-holes 11y having inner side surfaces covered by the first insulation layer 12. The metal layer 22 is used as a feeding layer used when forming, for example, the first conductive layer 13 by an electroplating method. For example, a copper (Cu) plate or a copper (Cu) foil may be used as the metal layer 22. In this embodiment, a copper plate is used as the metal layer 22.

Figure 11:
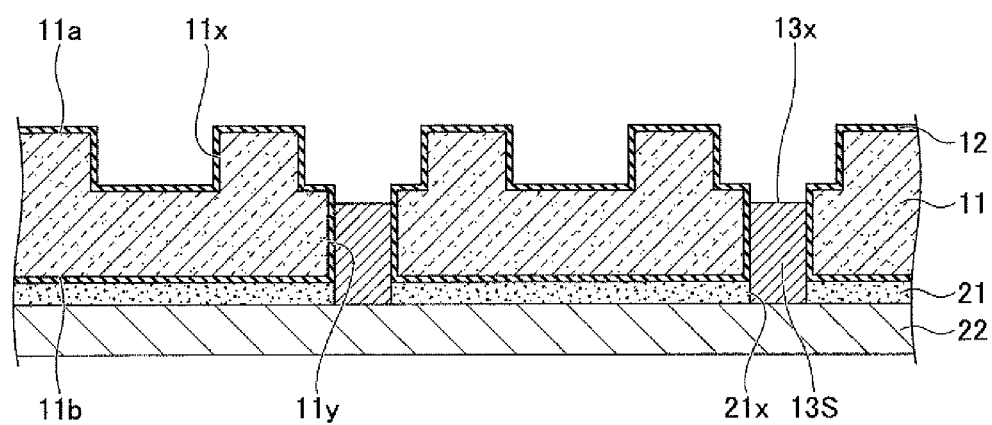

Then, in the process illustrated in FIG. 11, the first conductive layer 13S fills at least a portion of the through-holes 11y. The first conductive layer 13S is formed by depositing (growing) a plating film inside the through-holes 11y from the metal layer 22. The first conductive layer 13S is deposited (grown) by using an electroplating method where the metal layer 22 is used as the feeding layer. As described below, the first conductive layer 13S subsequently becomes the first conductive layer 13 after unnecessary parts are removed therefrom. The material of the first conductive layer 13S may be, for example, copper (Cu). The first conductive layer 13S may fill the inside of the through-holes 11y except at an upper part (toward the trenches 11x) of the through-holes 11y. Thereby, the concave part 13x is formed by the upper surface of the first conductive layer 13S and the inner side walls of the through-holes 11y.

As described above, although the entire inside of the through-holes 11y including the upper part (toward the trenches 11x) of the through-holes may be filled with the first conductive layer 13S (i.e. forming the first conductive layer 13S so that the upper surface of the first conductive layer 13S is substantially flush with the inner bottom surface of the trench 11x), the first conductive layer 13S should not project from the inner bottom surface of the trench 11x. The depth of the concave part 13X may be, for example, approximately 0 μm-10 μm.

The first conductive layer 13S is formed by growing a plating film only from the side of the metal layer 22 (only from one direction) owing to the first insulation layer 12 covering the inner side surface of the through-hole 11y. Therefore, unlike the related art example of the wiring substrate 100 where defects (e.g., seams, voids) occur due to a plating film growing from two directions, such defects can be prevented from occurring at the first conductive layer 13S. As a result, disconnection of the first conductive layer 13S due to thermal stress caused by such defects (e.g., seams, voids) can be prevented. Thus, the degrading of connecting reliability between the first conductive layer 13S and the second external connection terminal 19 can be prevented.

Figure 12:
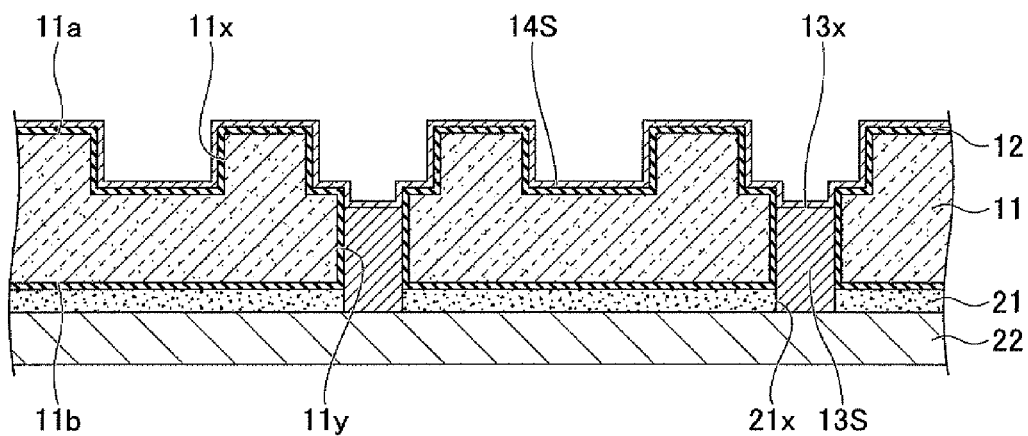

Then, in the process illustrated in FIG. 12, the second conductive layer 14S is formed on a portion of the first insulation layer 12 covering the first surface 11a of the substrate body 11, a portion of the first insulation layer 12 covering the inner bottom surface and the inner side surfaces of the trenches 11x, and the inside of the concave part 13x by using, for example, a sputtering method. As described below, the second conductive layer 14S is subsequently formed into the second conductive layer 14 after unnecessary portions are removed therefrom. For example, the second conductive layer 14S may be a conductive layer including a titanium (Ti) film and a copper (Cu) film stacked in this order on the first insulation layer 12 or the first conductive layer 13. The thickness of the second conductive layer 14S may be, for example, approximately 1 μm.

Figure 13:
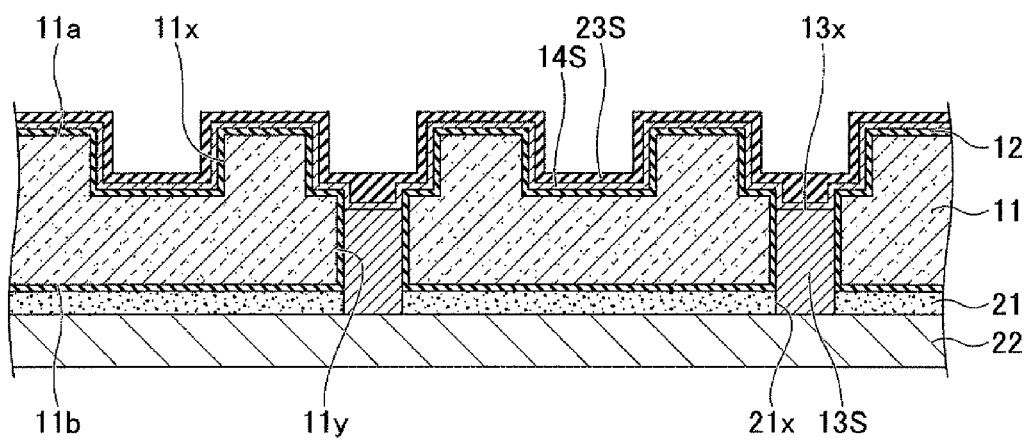

Then, in the process illustrated in FIG. 13, a resist layer 23S, which covers the second conductive layer 14S, is formed. As described below, the resist layer 23S subsequently becomes the resist layer 23 after unnecessary parts are removed therefrom. More specifically, for example, a liquid-like or a paste-like resist material containing a photosensitive resin composition is coated onto the second conductive layer 14S. The photosensitive resin composition may include, for example, an epoxy resin or an imide resin. Alternatively, a film-like resist material (e.g., dry film resist) containing the photosensitive resin composition may be laminated onto the second conductive layer 14S. The thickness of the resist layer 23S may be, for example, approximately a few μm. Although the resist layer 23S described in this embodiment is formed of a positive type resist material, the resist layer 23S may also be formed of a negative type resist material.

Figure 14:
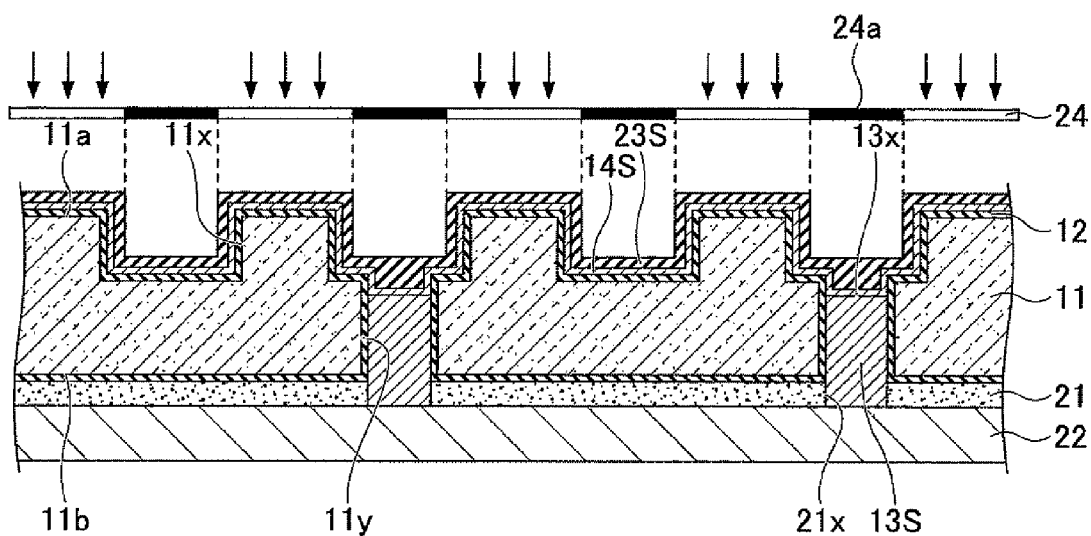

Then, in the process illustrated in FIG. 14, the resist layer 23S is exposed by light irradiated in a direction indicated with arrows in FIG. 14 via a mask 24 including light blocking parts 24a. In this embodiment, the light blocking parts 24a are formed so that a part of the resist layer 23S formed on the first surface 11a of the substrate body 11 and a part of the resist layer 23S formed on the inner side surface of the trench 11x are exposed to the light.

Figure 15:
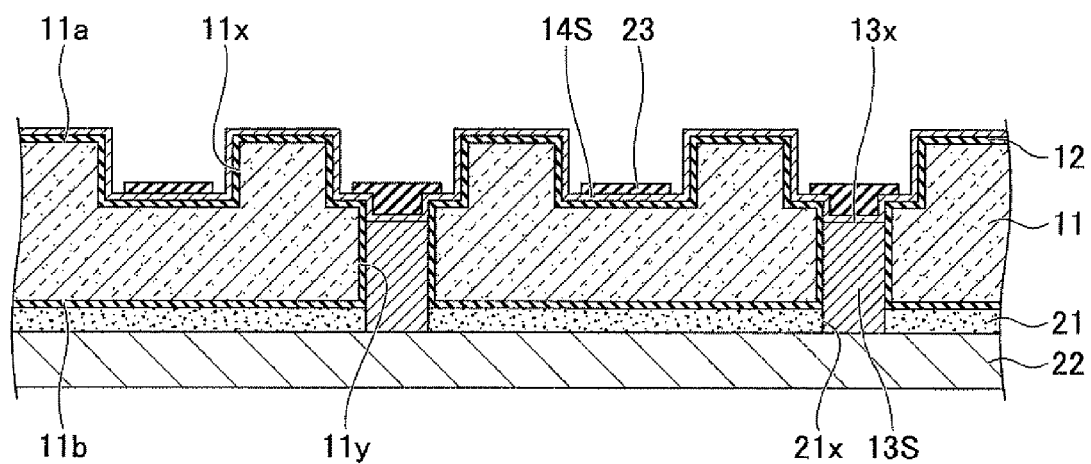

Then, in the process illustrated in FIG. 15, the exposed parts of the resist layer 23S are developed. Thereby, the part of the resist layer 23S formed on the first surface 11a of the substrate body 11 and the part of the resist layer 23S formed on the inner side surface of the trench 11x are removed. The resist layer 23S is formed on the inner bottom surface of the trench 11x except for the outer edge part of the inner bottom surface. In other words, spaces having a substantially constant width are formed between a side surface of the resist layer 23 and a portion of the second conductive layer 14S formed on the inner side surface of the trench 11x via the first insulation layer 12. The spaces correspond to the thickness of the part of the resist layer 23S (see FIG. 14) formed on the inner side surface of the trench 11x before being removed by the exposure. The width of the space may be, for example, a few μm.

Figure 16:
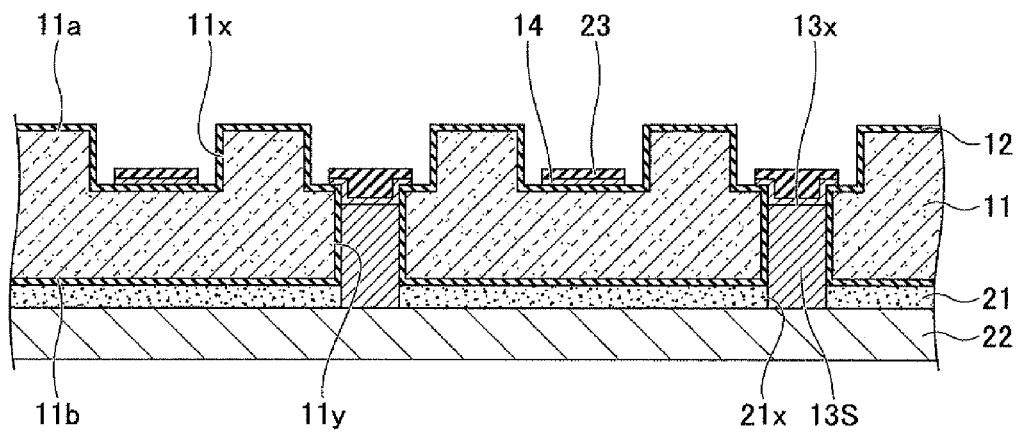
Figure 17:
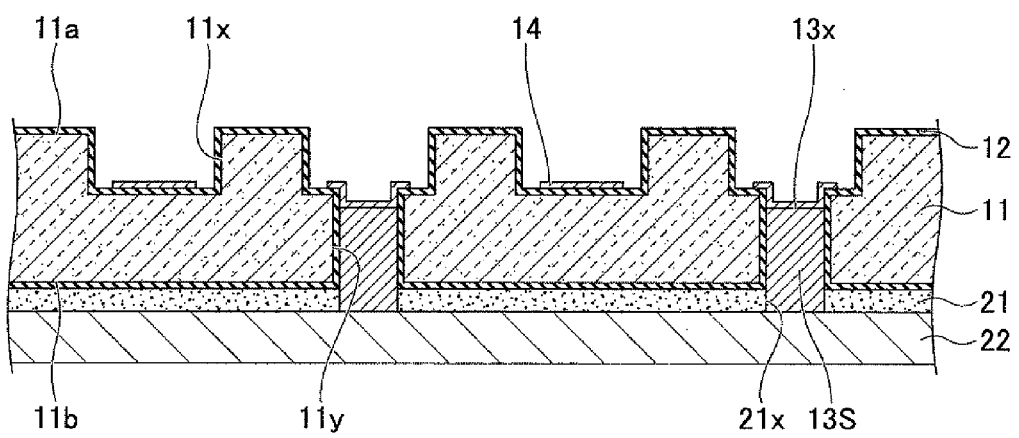

Then, in the process illustrated in FIG. 16, the second conductive layer 14S illustrated in FIG. 15 is etched by using the resist layer 23 as a mask. Accordingly, parts of the second conductive layer 14S that are not covered by the resist layer 23 are removed. Thereby, the second conductive layer 14 being covered by the resist layer 23 is formed. Then, in the process illustrated in FIG. 17, the resist layer 23 is removed.

Figure 18:
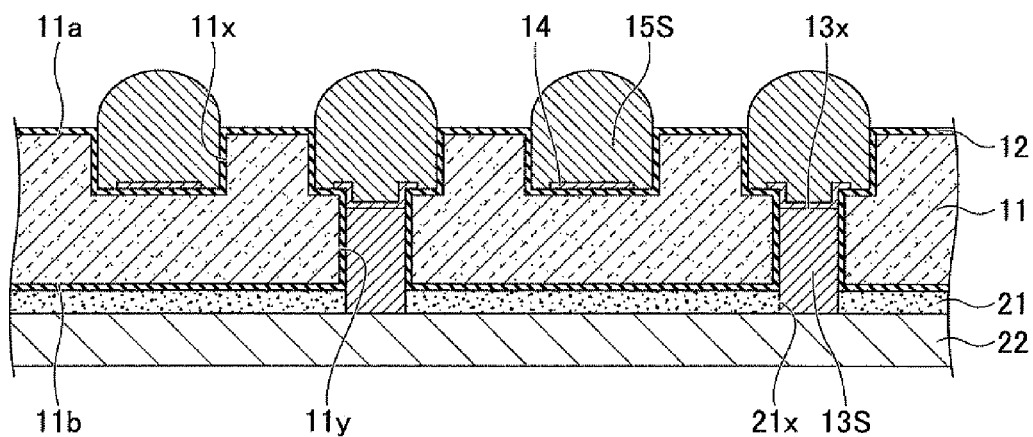

Then, in the process illustrated in FIG. 18, the third conductive layer 15S is formed by depositing (growing) a plating film inside the trench 11x from the second conductive layer 14. The third conductive layer 15S is deposited (grown) by using an electroplating method where the metal layer 22, the first conductive layer 13S, and the second conductive layer 14 are used as feeding layers. As described below, the third conductive layer 15S subsequently becomes the third conductive layer 15 after unnecessary parts are removed therefrom. The material of the third conductive layer 15S may be, for example, copper (Cu). The third conductive layer 15S projects from a portion of the upper surface of the first insulation layer 12 covering the first surface 11a of the substrate body 11. The amount in which the third conductive layer 15S projects from the portion of the upper surface of the first insulation layer 12 is, for example, approximately 30 µm-40 µm.

The third conductive layer 15S is formed by growing a plating film only from the side of the second conductive layer 14 (only from one direction) because the entire inner side surface of the trench 11x and the outer edge part of the outer edge part of the inner bottom surface of the trench 11x are covered by the first insulation layer 12. Therefore, unlike the related art example of the wiring substrate 100 where defects (e.g., seams, voids) occur due to a plating film growing from two directions, such defects can be prevented from occurring at the third conductive layer 15S. As a result, disconnection due to thermal stress caused by such defects (e.g., seams, voids) can be prevented from occurring at the third conductive layer 15S. Thus, the degrading of connecting reliability between the third conductive layer 15S and the first external connection terminal 18 can be prevented.

Figure 19:
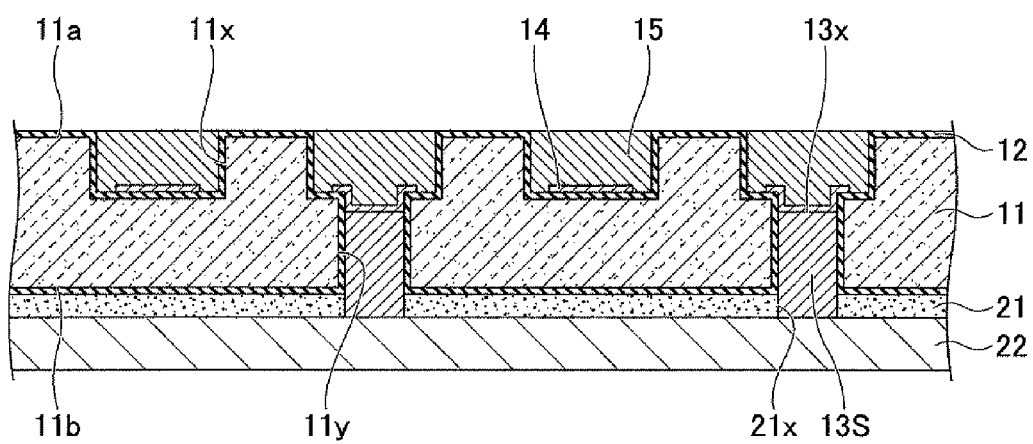

Then, in the process illustrated in FIG. 19, the third conductive layer 15 is formed by polishing the part of the third conductive layer 15S projecting from the side of the first surface 11a of the substrate body 11 with, for example, a CMP (Chemical Mechanical Polishing) method. The upper surface of the third conductive layer 15 becomes substantially flush with the upper surface of the portion of the first insulation layer 12 covering the first surface 11a of the substrate body 11. By completing the process of FIG. 18, a wiring pattern including the third conductive layer 15 is formed.

Figure 20:
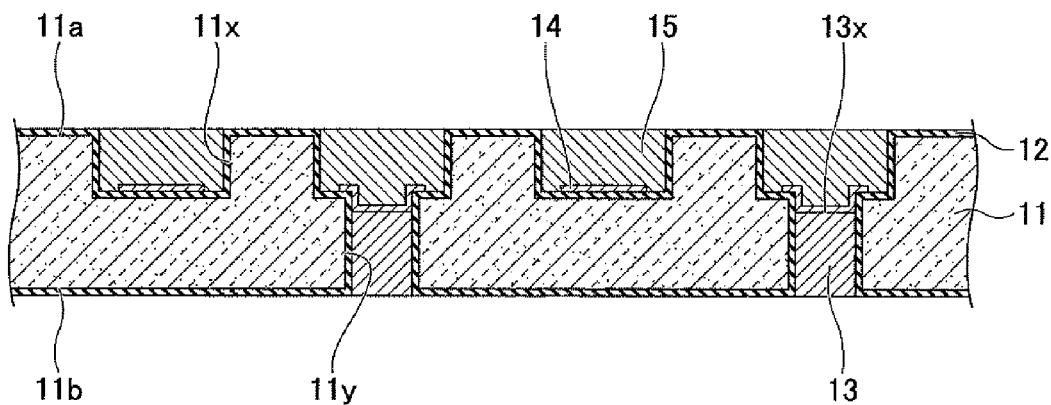

Then, in the process illustrated in FIG. 20, the first conductive layer 13 is formed by removing the adhesive layer 21 and the metal layer 22 and then polishing the part of the first conductive layer 13S projecting from the side of the second surface 11b of the substrate body 11 (see FIG. 19).

The metal layer 22 (in this embodiment, copper plate) is removed by a wet-etching method using, for example, an aqueous ferric chloride solution, an aqueous cupric chloride solution, or an ammonium persulfate solution. In a case where the third conductive layer 15 is formed of copper (Cu), an exposed surface of the third conductive layer 15 is to be masked for preventing the exposed surface of the third conductive layer 15 from being etched together with the metal layer 22. The adhesive layer 21 can be removed by using, for example, an ashing method. The lower surface of the first conductive layer 13 (i.e. a surface of the first conductive layer 13 opposite from the surface of the first conductive layer 13 toward the trench 11x) becomes substantially flush with the portion of the bottom surface of first insulation layer 12 covering the second surface 11b of the substrate body 11.

Then, after the process illustrated in FIG. 20, the second insulation layer 16 including the opening part 16x, the third insulation layer 17 including the opening part 17x, the first external connection terminal 18, and the second external connection terminal 19 are formed by using a known method. Thereby, the manufacturing of the wiring substrate 10 is completed as illustrated in FIGS. 5 and 6. As described above, the wiring substrate 10 may be formed without the first and second external connection terminals 18, 19.

According to the above-described first embodiment of the present invention, the metal layer 22 is provided on the second surface 11b of the substrate body 11 via the adhesive layer 21. Then, the first conductive layer 13 is formed by performing an electroplating method using the metal layer 22 as a feeding layer. More specifically, the first conductive layer 13 is formed by growing a plating film from only one direction inside the through-hole 11y having inner side surfaces covered by the first insulation layer 12. Accordingly, defects (e.g., seams, voids) can be prevented from occurring at the first conductive layer 13. As a result, disconnection of the first conductive layer 13 due to thermal stress caused by such defects (e.g., seams, voids) can be prevented. Thus, the degrading of connecting reliability between the first conductive layer 13 and the second external connection terminal 19 can be prevented.

Further, the second conductive layer 14 covers the upper surface of the first conductive layer 13 (surface of the first conductive layer 13 toward the trench 11x) and a part of the first insulation layer 12 covering the inner bottom surface of the trench 11x except for the outer edge part of the inner bottom surface of the trench 11X. Further, the third conductive layer 15 is formed by growing a plating film from only one direction inside the concave part 13x and the trench 11x where the plating film is grown by an electroplating method using the metal layer 22, the first conductive layer 13, and the second conductive layer 14 as the feeding layers. Accordingly, defects (e.g., seams, voids) can be prevented from occurring at the third conductive layer 15. As a result, disconnection of the third conductive layer 15 due to thermal stress caused by such defects (e.g., seams, voids) can be prevented. Thus, the degrading of connecting reliability between the third conductive layer 15 and the first external connection terminal 18 can be prevented.

It is to be noted that, in order to manufacture the wiring substrate 10 with the above-described processes, the configuration of the wiring substrate 10 is to have the second conductive layer 14 interposed between the first conductive layer 13 and the third conductive layer 15.

First Modified Example of First Embodiment

In the above-described first embodiment, the second conductive layer 14 covers the upper surface of the first conductive layer 13 (surface of the first conductive layer 13 toward the trench 11x) and a part of the first insulation layer 12 covering the inner bottom surface of the trench 11x except for the outer edge part of the inner bottom surface of the trench 11X where a part of the second conductive layer 14 is used as a feeding layer for performing an electroplating method. In the following first modified example of the first embodiment, a second conductive layer 14A covers the upper surface of the first conductive layer 13 (surface of the first conductive layer 13 toward the trench 11x), an entire part of the first insulation layer 12 covering the inner bottom surface of the trench 11x, and a part of the first insulation layer 12 covering the inner side surface of the trench 11x (inner side surface toward the inner bottom surface of the trench 11x). Further, the second conductive layer 14A is used as a part of a feeding layer for performing an electroplating method.

Figure 21:
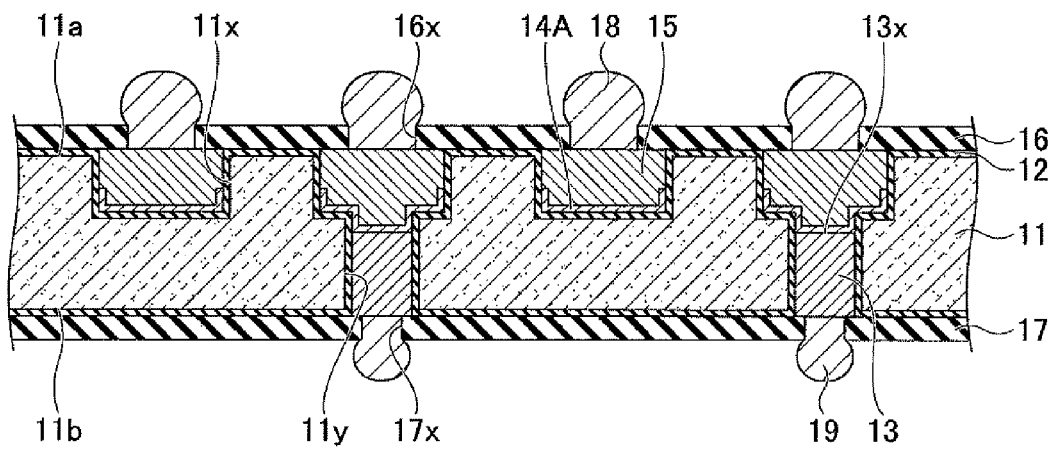
FIG. 21 is a cross-sectional view of a wiring substrate according to a first modified example of the first embodiment of the present invention.

FIG. 21 is a cross-sectional view of a wiring substrate 10A according to the first modified example of the first embodiment. With reference to FIG. 21, the wiring substrate 10A is different from the above-described wiring substrate 10 (see, for example, FIGS. 5 and 6) in that the second conductive layer 14 is replaced with the second conductive layer 14A.

The second conductive layer 14A is formed inside the concave part 13x and a portion of the trench 11x. More specifically, in this modified example, the second conductive layer 14A covers the upper surface of the first conductive layer 13 (surface of the first conductive layer 13 toward the trench 11x), the entire part of the first insulation layer 12 covering the inner bottom surface of the trench 11x, and the part of the first insulation layer 12 covering the inner side surface of the trench 11x (inner side surface toward the inner bottom surface of the trench 11x).

The width of the part of the second conductive layer 14A covering the inner side surface of the trench 11x (thickness direction of the wiring substrate 10A) may be, for example, approximately 1 μm-5 μm. Even by forming the part of the second conductive layer 14A with such width, the plating film grows only in one direction (toward the inner bottom surface of the trench 11x) when forming the third conductive layer 15 in the trench 11x. Therefore, defects (e.g., seams, voids) can be prevented from occurring in the third conductive layer 15.

The second conductive layer 14A may have a stacked configuration including a titanium (Ti) film and a copper (Cu) film that are stacked on the first insulation layer 12 or the first conductive layer 13 in this order. The thickness of the second conductive layer 14A may be, for example, approximately 1 μm.

The second conductive layer 14A can be formed by modifying a corresponding process of the first embodiment illustrated in FIG. 14. That is, after performing the processes illustrated in FIGS. 7-13, the resist layer 23S is exposed to light in the same manner as the process illustrated in FIG. 14. In this first modified example of the first embodiment, the shape of the light blocking part 24A of the mask 24 is changed so that only the resist layer 23S formed on the first surface 11a of the substrate body 11 is exposed to light.

Figure 22:
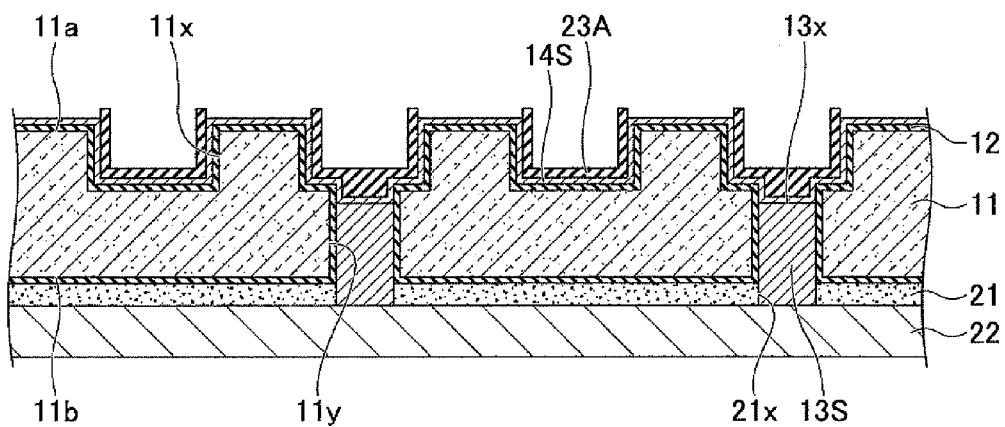
FIG. 22 is a schematic diagram illustrating processes of a wiring substrate manufacturing method according to the first modified example of the first embodiment of the present invention.

Then, in the process illustrated in FIG. 22, the exposed parts of the resist layer 23S are developed. Thereby, the part of the resist layer 23S formed on the first surface 11a of the substrate body 11 is removed. Accordingly, a resist layer 23A is formed on the inner bottom surface and the inner side surface of the trench 11x. Then, in the same manner as the process of the first embodiment illustrated in FIG. 16, the second conductive layer 14S is etched by using the resist layer 23A as a mask. Thereby, the second conductive layer 14S that is not covered by the resist layer 23A is removed. Accordingly, the second conductive layer 14A as illustrated in FIG. 21 is formed. By adjusting the amount of time in etching the second conductive layer 14S, a part of the second conductive layer 14S formed on the first insulation layer 12 (part of the second conductive layer 14S toward the first surface 11a of the substrate body 11) covering the inner side surface of the trench 11x can be removed. Then, by performing the same processes as the processes illustrated in FIGS. 17-20, the wiring substrate 10A illustrated in FIG. 21 can be obtained.

Similar to the first embodiment, the above-described first modified example of the first embodiment can also prevent defects (e.g., seams, voids) from occurring at the first conductive layer 13. As a result, disconnection of the first conductive layer 13 due to thermal stress caused by such defects (e.g., seams, voids) can be prevented. Thus, the degrading of connecting reliability between the first conductive layer 13 and the second external connection terminal 19 can be prevented.

Further, the second conductive layer 14A covers the upper surface of the first conductive layer 13 (surface of the first conductive layer 13 toward the trench 11x), the entire part of the first insulation layer 12 covering the inner bottom surface of the trench 11x, and the part of the first insulation layer 12 covering the inner side surface of the trench 11x. Further, the third conductive layer 15 is formed by growing a plating film inside the concave part 13x and the trench 11x by using an electroplating method where the metal layer 22, the first conductive layer 13, and the second conductive layer 14A are used as feeding layers. In performing the electroplating method, the plating film slightly grows from the second conductive layer 14A formed on the part of the first insulation layer 12 covering the inner side surface of the trench 11x. However, most part of the plating film grows from the second conductive layer 14A covering the entire part of the first insulation layer 12 covering the inner bottom surface of the trench 11x. Accordingly, the plating film can be grown in substantially a single direction. As a result, defects (e.g., seams, voids) can be prevented from occurring at the third conductive layer 15. As a result, disconnection of the third conductive layer 15 due to thermal stress caused by such defects (e.g., seams, voids) can be prevented. Thus, the degrading of connecting reliability between the third conductive layer 15 and the first external connection terminal 18 can be prevented.

Second Modified Example of First Embodiment

In the above-described first embodiment, the trench 11x is open toward the first surface 11a of the substrate body 11 and has a cross section formed in a substantially rectangular shape. However, the cross section of the trench 11x is not limited to the substantially rectangular shape. In the following second modified example of the first embodiment, a trench having a tapered cross section is formed in the substrate body 11.

Figure 23:
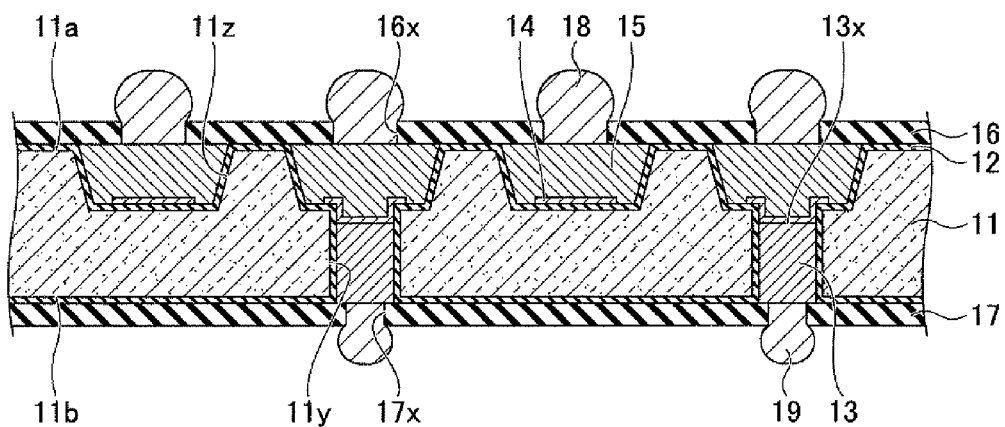
FIG. 23 is a cross-sectional view of a wiring substrate according to a first modified example of the first embodiment of the present invention.

FIG. 23 is a cross-sectional view of a wiring substrate 10B according to the second modified example of the first embodiment. With reference to FIG. 23, the wiring substrate 10B is different from the above-described wiring substrate (see, for example, FIGS. 5 and 6) in that the trenches 11x are replaced with trenches 11z.

The trenches 11z are open toward the first surface 11a of the substrate body 11 and have a tapered cross section. The trenches 11z are areas in which a wiring pattern including the third conductive layer 15 is formed. Therefore, the trenches 11z are to be discretionally formed in correspondence with the shape of the wiring pattern. The width of the inner bottom surface of the trench 11z may be, for example, approximately 50 μm-70 μm. The opening of the trench 11z formed at the first surface 11a of the substrate body 11 has a width (e.g., approximately 100 μm-150 μm) larger than the width of the inner bottom surface of the trench 11z (e.g., approximately 50 μm-70 μm). The depth of the trenches 11z may be, for example, approximately 40 μm-60 μm. The pitch between the trenches 11z may be, for example, approximately 80 μm-100 μm. The trenches 11z, which are not illustrated in communication with the through-holes 11y in FIG. 23, are in communication with the through-holes 11y at other parts of the trenches 11z not illustrated in FIG. 23.

For example, the trenches 11z can be obtained by forming a resist layer for forming openings at corresponding parts of the first surface 11a of the substrate body 11 and etching the corresponding parts of the substrate body 11 using the resist layer as a mask. The etching may be performed by using, for example, an isotropic etching method such as dry etching or an anisotropic etching method such as wet etching.

In addition to attaining the same advantages as the above-described first embodiment, the second modified example of the first embodiment can attain the following advantage. That is, by forming the trenches 11z having tapered cross sections in the substrate body 11, the amount of stress applied to the third conductive layer 15 can be reduced compared to the substrate body 11 formed with the trenches 11x having rectangular cross sections.

Second Embodiment

In the above-described first embodiment, the second conductive layer 14 covers the upper surface of the first conductive layer 13 (surface of the first conductive layer 13 toward the trench 11x) and a part of the first insulation layer 12 covering the inner bottom surface of the trench 11x except for the outer edge part of the inner bottom surface of the trench 11x where a part of the second conductive layer 14 is used as a feeding layer for performing an electroplating method. In the following second embodiment, a second conductive layer 14B covers the entire part of the first insulation layer 12 covering the inner bottom surface of the trench 11x and the entire part of the first insulation layer 12 covering the inner side surface of the trench 11x where a part of the second conductive layer 14B is used as a feeding layer for performing an electroplating method.

Configuration of Wiring Substrate According to Second Embodiment

Figure 24:
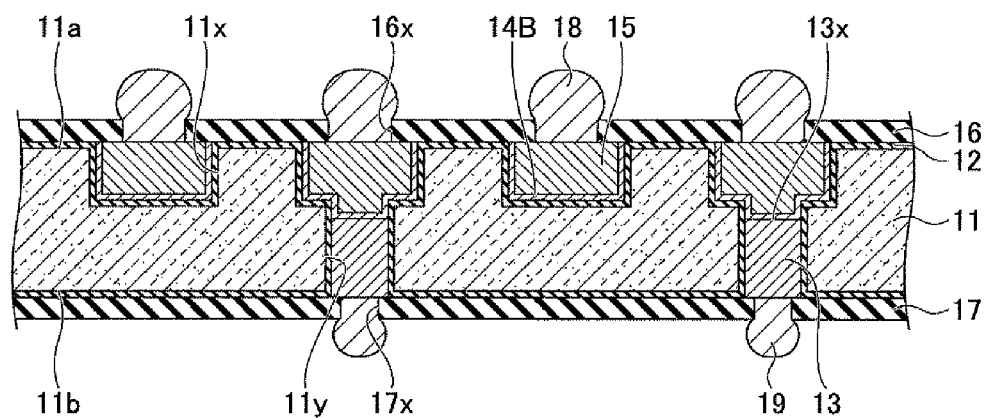
FIG. 24 is a cross-sectional view of a wiring substrate according to a second embodiment of the present invention.

First, a configuration of a wiring substrate 10C according to the second embodiment of the present invention is described. FIG. 24 is a cross-sectional view of the wiring substrate 10C according to the second embodiment of the present invention. With reference to FIG. 24, the wiring substrate 10C is different from the above-described wiring substrate 10 (see, for example, FIGS. 5 and 6) in that the second conductive layer 14 is replaced with a second conductive layer 14B.

The second conductive layer 14B is formed in the concave part 13x and the trench 11x. More specifically, the second conductive layer 14B covers the upper surface of the first conductive layer 13 (surface of the first conductive layer 13 toward the trench 11x), the entire part of the first insulating layer 12 covering the inner bottom surface of the trench 11x, and the entire part of the first insulating layer 12 covering the inner side surface of the trench 11x even in the case where no concave part 13x is formed (i.e. the case where the upper surface of the first conductive layer 13 is substantially flush with the first insulating layer 12 formed on the bottom surface of the trench 11x). The second conductive layer 14B may be a conductive layer including a titanium (Ti) film and a copper (Cu) film stacked in this order on the first insulation layer 12 or the first conductive layer 13. The thickness of the second conductive layer 14B may be, for example, approximately 1 µm.

Method for Manufacturing Wiring Substrate According to Second Embodiment

Figure 25:
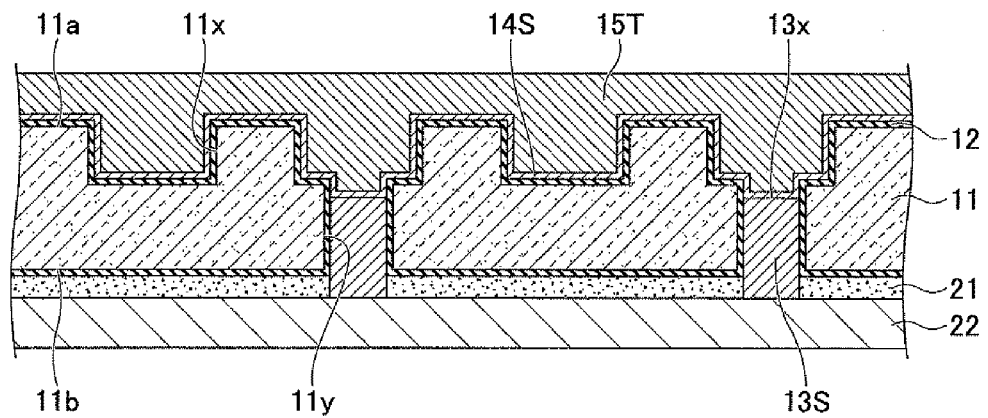
FIGS. 25-27 are schematic diagrams illustrating processes of a wiring substrate manufacturing method according to the second embodiment of the present invention (parts 1-3)
Figure 26:
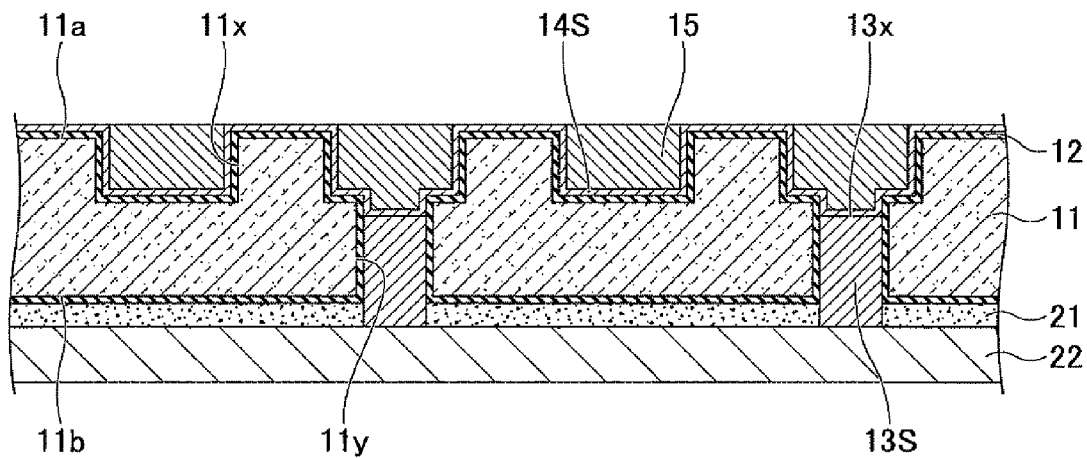
Figure 27:
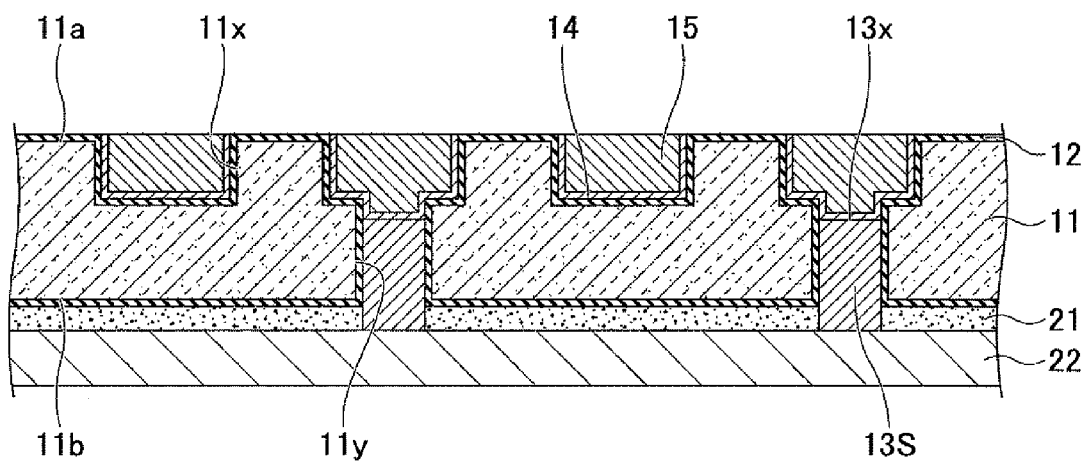

Next, a method for manufacturing a wiring substrate according to a second embodiment of the present invention is described. FIGS. 25-27 are schematic diagrams illustrating processes of a wiring substrate manufacturing method according to the second embodiment of the present invention.

First, the same processes as the processes of the first embodiment illustrated in FIGS. 7-20 are performed. Then, in the process illustrated in FIG. 25, a third conductive substrate body 15T is formed by depositing (growing) a plating film inside the concave part 13x, inside the trench 11x, and on the first surface 11a by an electroplating method using the metal layer 22, the first conductive layer 13S, and the second conductive layer 14S as the feeding layers. As described below, the third conductive layer 15T is subsequently formed into the third conductive layer 15 after unnecessary portions are removed therefrom. The material of the third conductive layer 15T may be, for example, copper (Cu). The thickness of the third conductive layer 15T formed on the first surface 11a may be, for example, approximately 30 µm-40 µm.

Because the second conductive layer 14S is formed inside the concave part 13x, on the inner bottom surface of the trench 11x, and on the inner side surface of the trench 11x, the plating film grows from two directions. That is, the plating film grows from the inner bottom surface of the trench 11x and from the inner side surface of the trench 11x. Therefore, defects (e.g., seams, voids) may occur similar to those of the wiring substrate 100 of the related art example. However, defects (e.g., seams, voids) would not or hardly occur in the case where the aspect ratio of the trench 11x is low. Therefore, the use of the manufacturing method of the second embodiment would not be a problem in the case where the aspect ratio of the trench 11x is low. In other words, the manufacturing method of the second embodiment is suitable for manufacturing a wiring substrate that includes trenches 11x having low aspect ratio and preventing defects (e.g., seams, voids) from occurring.

Then, in the process illustrated in FIG. 26, the third conductive layer 15T formed on the first surface 11a of the substrate body 11 (see, for example, FIG. 25) is polished by using, for example, a CMP (Chemical Mechanical Polishing) method. Then, in the process illustrated in FIG. 27, the second conductive layer 14S formed on the portion of the first insulation layer 12 covering the first surface 11a of the substrate body 11 (see, for example, FIG. 26) is removed by etching. Thereby, the second conductive layer 14 is formed. Accordingly, the upper surface of the third conductive layer 15 becomes substantially flush with the portion of the upper surface of the first insulation layer 12 covering the first surface 11a of the substrate body 11.

Then, in the same manner as the process of the first embodiment illustrated in FIG. 20, the adhesive layer 21 and the metal layer 22 are removed. Further, the first conductive layer 13 is formed by polishing the first conductive layer 13S projecting from the side of the second surface 11b of the substrate body 11. Further, the second insulation layer 16 including the opening parts 16x, the third insulation layer 17 including the openings parts 17x, the first external connection terminals 18, and the second external connection terminals 19 are formed by using known methods. Thereby, the manufacturing of the wiring substrate 10C illustrated in FIG. 24 is completed. As described above, the wiring substrate 10C may be formed without the first and second external connection terminals 18, 19.

According to the above-described second embodiment of the present invention, the metal layer 22 is provided on the second surface 11b of the substrate body 11 via the adhesive layer 21. Then, the first conductive layer 13 is formed by performing an electroplating method using the metal layer 22 as a feeding layer. More specifically, the first conductive layer 13 is formed by growing a plating film from only one direction inside the through-hole 11y having inner side surfaces covered by the first insulation layer 12. Accordingly, defects (e.g., seams, voids) can be prevented from occurring at the first conductive layer 13. As a result, disconnection of the first conductive layer 13 due to thermal stress caused by such defects (e.g., seams, voids) can be prevented. Thus, the degrading of connecting reliability between the first conductive layer 13 and the second external connection terminal 19 can be prevented.

Further, the second conductive layer 14B covers the upper surface of the first conductive layer 13 (surface of the first conductive layer 13 toward the trench 11x), the part of the first insulation layer 12 covering the inner bottom surface of the trench 11x, and the part of the first insulation layer 12 covering the inner side surface of the trench 11x. Further, the third conductive layer 15 is formed by growing a plating film from only one direction inside the concave part 13x and the trench 11x where the plating film is grown by an electroplating method using the metal layer 22, the first conductive layer 13, and the second conductive layer 14B as the feeding layers. Although the plating film grows from two directions (one from the inner bottom surface of the trench 11x and the other from the inner side surface of the trench 11x) by performing the electroplating method, the growth from two directions is not a problem because defects (e.g., seams, voids) would not or hardly occur owing to the low aspect ratio of the trench 11x.

In other words, with respect to the through-holes 11y having a high aspect ratio where defects (e.g., seams, voids) easily occur, such defects are prevented from occurring by growing the plating film from a single direction. With respect to the trenches 11x having a low aspect ratio where defects (e.g., seams, voids) hardly occur, the plating film can be grown from two directions. As a result, the plating film can be grown without causing defects (e.g., seams, voids) in the trenches 11x and the through-holes 11y.

Third Embodiment

In the first embodiment, the modified examples of the first embodiment, and the second embodiment of the present invention described above, the wiring substrate 10, 10A, 10B, and 10C include trenches 11x open toward the first surface 11a of the substrate body 11 and through-holes 11y having one end communicating with the inner bottom surface of the trenches 11x and the other end open toward the second surface 11b of the substrate body 11. In the following third embodiment of the present invention, a wiring substrate 10D includes through-holes 11t penetrating the substrate body 11 from the first surface 11a to the second surface 11b and has no trenches 11x.

Configuration of Wiring Substrate According to Third Embodiment

Figure 28:
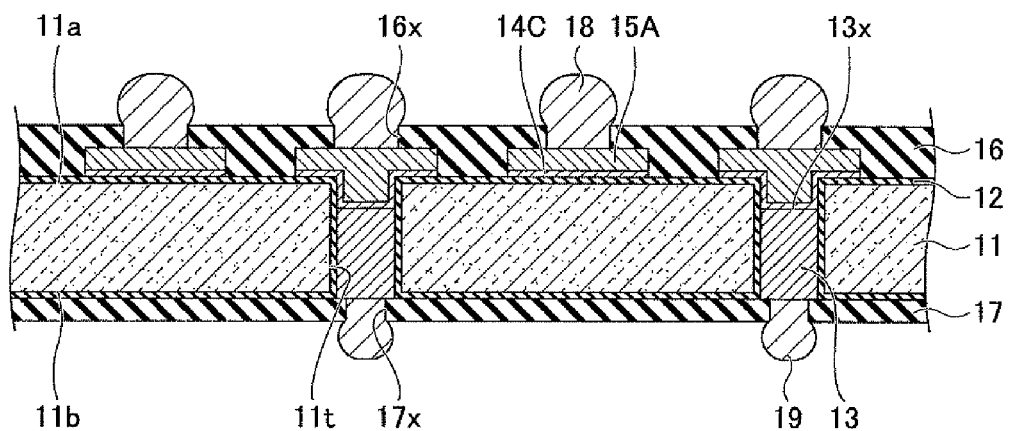
FIG. 28 is a cross-sectional view of a wiring substrate according to a third embodiment of the present invention.

First, a configuration of the wiring substrate 10D according to the third embodiment of the present invention is described. FIG. 28 is a cross-sectional view of the wiring substrate 10D according to the third embodiment of the present invention. With reference to FIG. 28, the wiring substrate 10D is different from the above-described wiring substrate 10 (see, for example, FIGS. 5 and 6) in that the wiring substrate 11D includes no trenches 11x and has the third conductive layer 15 projecting from the first surface 11a of the substrate body 11.

The through-holes 11t penetrates through the substrate body 11 from the first surface 11a to the second surface 11b. The plan shape of the through-holes 11t may be a substantially circle shape. The diameter of the through-holes 11t may be, for example, approximately 40 μm-60 μm. The depth of the through-holes 11t (thickness of substrate body 11) may be, for example, approximately 200 μm-400 μm. Thus, the through-holes 11t are formed having a relatively high aspect ratio.

The first conductive layer 13 fills a portion of the through-holes 11t that have inner side surfaces covered by the first insulation layer 12. In this embodiment, the inside of the through-holes 11t are filled with the first conductive layer 13 except at the upper part of the through-holes 11t (part of the through-holes 11t toward the first surface 11a of the substrate body 11). The upper surface of the first conductive layer 13 (surface of the first conductive layer 13 toward the first surface 11a of the substrate body 11) is located at a bottom of a concave that is recessed toward the second surface 11b of the substrate body 11 with respect to the first surface 11a of the substrate body 11. In other words, a concave part 13x is formed by the upper surface of the first conductive layer 13 and the part of the first insulation layer 12 covering the inner side surfaces of the through-hole 11t. The depth of the concave part 13x may be, for example, approximately 50 μm. The aspect ratio of the concave part 13x would be relatively low if the diameter of the through-holes 11t are approximately 40 μm-60 μm in the case where the depth of the concave part 13x is approximately 50 μm.

The second conductive layer 14C is formed inside the concave part 13x and a part of the first surface 11a of the substrate body 11. More specifically, the second conductive layer 14C covers the upper surface of the first conductive layer 13, the part of the first insulation layer 12 covering the inner surface of the through-holes 11t, and a part of the first surface 11a of the substrate body 11. The second conductive layer 14C is formed (patterned) into a predetermined planar shape. The second conductive layer 14C may have a stacked configuration including a titanium (Ti) film and a copper (Cu) film that are stacked on the first insulation layer 12 or the first conductive layer 13 in this order. The thickness of the second conductive layer 14C may be, for example, approximately 1 μm.

The third conductive layer 15A covers the second conductive layer 14C and fills the inside of the concave part 13x. Unlike the third conductive layer 15 of the above-described embodiments and modified examples, the third conductive layer 15A projects from the first surface 11a of the substrate body 11. The material of the third conductive layer 15A may be, for example, copper (Cu). The third conductive layer 15A forms a wiring pattern together with the second conductive layer 14C.

By using a titanium (Ti) film as a lowest (bottommost) film of the second conductive layer 14C, satisfactory adhesiveness can be attained between the second conductive layer 14C and the first insulation layer 12 in a case where the first insulation layer 12 is formed of, for example, silicon dioxide ($SiO_2$) or silicon nitride (SiN). Therefore, unlike placing the third conductive layer 15A directly on the first insulation layer 12, no spaces will be formed in-between layers owing to the third conductive layer 15A adhered to the first insulation layer 12 via the second conductive layer 14C Method for Manufacturing Wiring Substrate According to Third Embodiment Next, a method for manufacturing a wiring substrate according to a third embodiment of the present invention is described. FIGS. 29-33 are schematic diagrams illustrating processes of a wiring substrate manufacturing method according to the third embodiment of the present invention.

First, the same processes as the processes of the first embodiment illustrated in FIGS. 8-10 are performed. Then, in the process illustrated in FIG. 29, a first conductive layer 13T is formed by depositing (growing) a plating film inside the through-holes 11t from the side of the metal layer 22 by an electroplating method using the metal layer 22 as the feeding layer. Thereby, the through-holes 11t are filled with the first conductive layer 13T. The first conductive layer 13T has a side toward the upper surface of the first conductive layer 13T (side of the first conductive layer 13T toward the first surface 11a of the substrate body 11) that projects from the part of the upper surface of the first insulation layer 12 covering the first surface 11a of the substrate body 11. The amount in which the first conductive layer 13T projects from the part of the upper surface of the first insulation layer 12 may be, for example, approximately 30 μm-40 μm.

The material of the first conductive layer 13T may be, for example, copper (Cu). Because the inner side surfaces of the through-holes 11t are covered by the first insulation layer 12, the first conductive layer 13T can be formed by growing a plating film only from the metal layer 22 (i.e. growing only from a single direction). Therefore, unlike the related art example of the wiring substrate 100 where defects (e.g., seams, voids) occur due to a plating film growing from two directions, such defects can be prevented from occurring at the first conductive layer 13T. As a result, disconnection of the first conductive layer 13T due to thermal stress caused by such defects (e.g., seams, voids) can be prevented. Thus, the degrading of connecting reliability between the first conductive layer 13T and the second external connection terminal 19 can be prevented.

Figure 30:
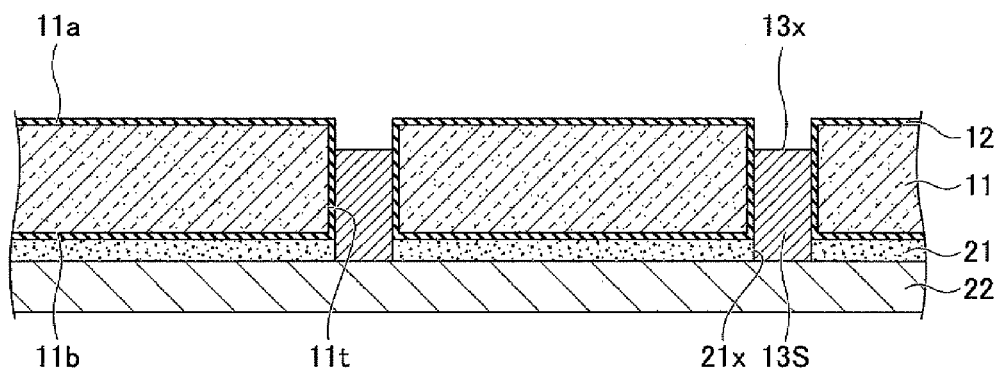

Then, in the process illustrated in FIG. 30, the first conductive layer 13S is formed by removing a portion of the first conductive layer 13T toward the first surface 11a of the substrate body 11. More specifically, a portion of the first conductive layer 13T projecting from the first surface 11a of the substrate body 11 is flattened by polishing using, for example, a CMP (Chemical Mechanical Polishing) method. Thereby, the upper surface of the first conductive layer 13T becomes substantially flush with the part of the upper surface of the first insulation layer 12 covering the first surface 11a of the substrate body 11. Then, a portion of the first conductive layer 13T toward the first surface 11a of the substrate body 11 is removed by, for example, a wet etching method or a dry etching method. Thereby, the first conductive layer 13S is formed. Accordingly, the concave part 13x is formed by the upper surface of the first conductive layer 13S (surface of the first conductive layer 13S toward the first surface 11a of the substrate body 11) and the part of the first insulation layer 12 covering the inner side surfaces of the through-holes 11t. The depth of the concave part 13x may be, for example, approximately 50 μm. The upper surface of the first conductive layer 13S (inner bottom surface of the concave part 13x) may be flattened by flattening the upper surface of the first conductive layer 13T and then etching (e.g., wet etching, dry etching) the flattened upper surface of the first conductive layer 13T.

Figure 31:
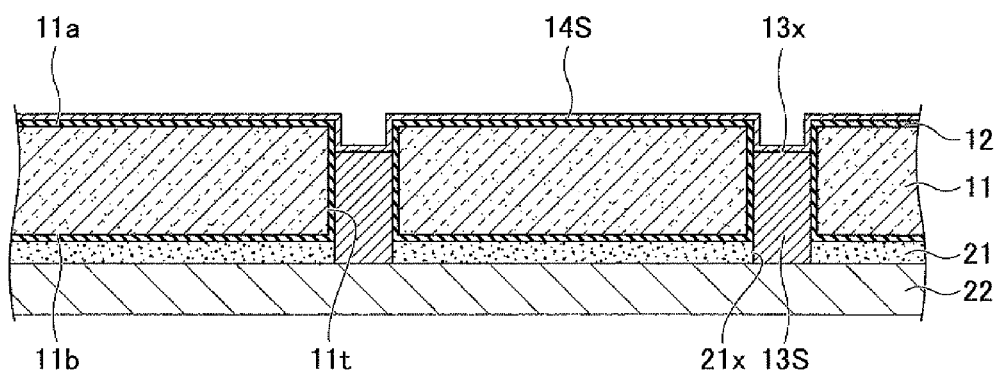

Then, in the process illustrated in FIG. 31, the second conductive layer 14S is formed inside the concave part 13x and on the part of the first insulation layer 12 covering the first surface 11a of the substrate body 11 by using, for example, a sputtering method. As described below, the second conductive layer 14S is subsequently formed into the second conductive layer 14C after unnecessary portions are removed therefrom. The second conductive layer 14S may have a stacked configuration including a titanium (Ti) film and a copper (Cu) film that are stacked on the first insulation layer 12 or the first conductive layer 13 in this order. The thickness of the second conductive layer 14S may be, for example, approximately 1 μm.

Figure 32:
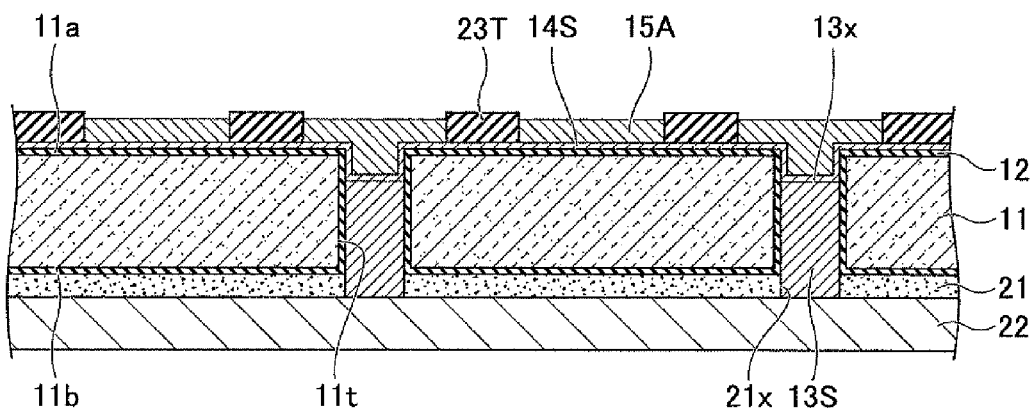

Then, in the process illustrated in FIG. 32, the resist layer 23T having opening parts are formed on the second conductive layer 14S. The opening parts formed in the resist layer 23T expose the areas at which a wiring pattern is to be formed. Then, the third conductive layer 15A is formed by growing a plating film on the second conductive layer 14S exposed in the opening parts of the resist layer 23T. The plating film is grown, for example, by an electroplating method where the metal layer 22, the first conductive layer 13S, and the second conductive layer 14S are used as feeding layers or by an electroless plating method. The material of may be, for example, the copper (Cu). The thickness of the third conductive layer 15A formed on the first surface 11a of the substrate body 11 may be, for example, approximately 10 μm-30 μm.

Figure 33:
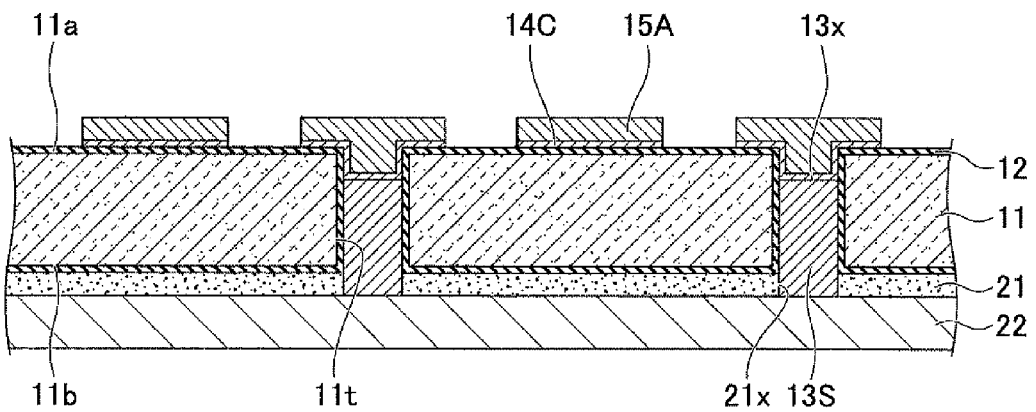

Then, in the process illustrated in FIG. 33, the parts of the second conductive layer 14S which are not covered by the third conductive layer 15A are removed after the removal of the resist layer 23T illustrated in FIG. 32. The parts of the second conductive layer 14S are removed by etching with the third conductive layer 15A used as a mask. Thereby, a wiring pattern having the third conductive layer 15A stacked on the second conductive layer 14C is formed.

Although not illustrated in the drawings, after the processes illustrated in FIG. 33 are completed, the adhesive layer 21 and the metal layer 22 are removed in the same manner as the process of the first embodiment illustrated in FIG. 20. Then, the first conductive layer 13 is formed by polishing the first conductive layer 13S projecting from the second surface 11b of the substrate body 11. Then, the second insulation layer 16 including the opening parts 16x, the third insulation layer 17 including the opening parts 17x, the first external connection terminal 18, and the second external connection terminal 19 are formed in the configuration illustrated in FIG. 28 by using known methods. As described above, the wiring substrate 10D may be formed without the first and second external connection terminals 18, 19.

Figure 29:
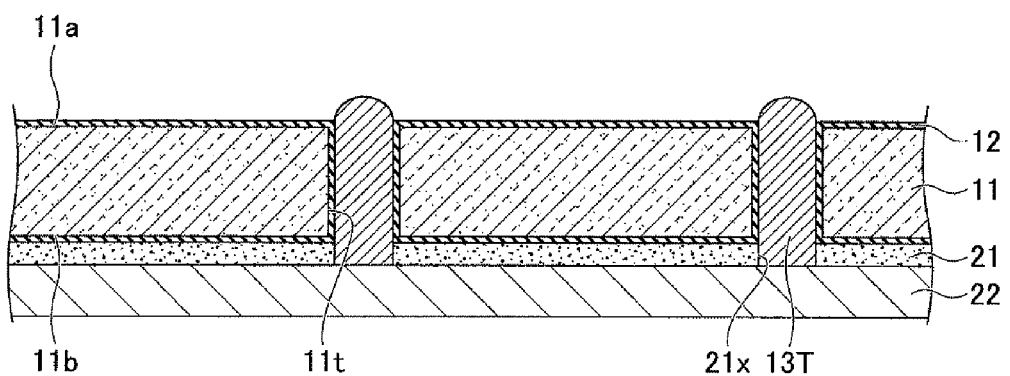
FIGS. 29-33 are schematic diagrams illustrating processes of a wiring substrate manufacturing method according to the third embodiment of the present invention (parts 1-5).

Alternatively, the processes illustrated in FIG. 29 may be omitted to form the first conductive layer 13S rather than the first conductive layer 13T. That is, in the process illustrated in FIG. 30, a plating film may be grown inside the through-hole 11t from the metal layer 22 to a midsection of the through-hole 11t with a space of approximately 50 μm remaining at an upper part of the through-hole 11t by using an electroplating method with the metal layer 22 as the feeding layer.

Alternatively, in the processes illustrated in FIG. 32, the third conductive layer 15A may be formed by growing a plating film on the exposed areas of the second conductive layer 14S inside the opening parts of the resist layer 23T by using an electroplating method with the second conductive layer 14S as the feeding layer. In this case, the adhesive layer 21 and the metal layer 22 may be removed before the forming of the third conductive layer 15A.

According to the above-described third embodiment of the present invention, the metal layer 22 is provided on the second surface 11b of the substrate body 11 via the adhesive layer 21. Then, the first conductive layer 13 is formed by performing an electroplating method using the metal layer 22 as a feeding layer. More specifically, the first conductive layer 13 is formed by growing a plating film from only one direction inside the through-hole 11y having inner side surfaces covered by the first insulation layer 12. Accordingly, defects (e.g., seams, voids) can be prevented from occurring at the first conductive layer 13. As a result, disconnection of the first conductive layer 13 due to thermal stress caused by such defects (e.g., seams, voids) can be prevented. Thus, the degrading of connecting reliability between the first conductive layer 13 and the second external connection terminal 19 can be prevented.

Further, the second conductive layer 14B covers the part of the first insulation layer 12 covering the first surface 11a of the substrate body 11 and the inside of the concave part 13x. Further, the third conductive layer 15A is formed by growing a plating film inside the concave part 13x and a part of the first surface 11a of the substrate body 11. The plating film is grown, for example, by an electroplating method where the metal layer 22, the first conductive layer 13S, and the second conductive layer 14S (or only the second conductive layer 14S) are used as feeding layers or by an electroless plating method. Although the plating film grows from two directions (one from the inner bottom surface of the concave part 13x and the other from the inner side surface of the concave part 13x) by performing the electroplating method, the growth from two directions is not a problem because defects (e.g., seams, voids) would not or hardly occur owing to the low aspect ratio of the concave part 13x.

In other words, with respect to the through-holes 11t having a high aspect ratio where defects (e.g., seams, voids) easily occur, such defects are prevented from occurring by growing the plating film from a single direction. With respect to the concave part 13x having a low aspect ratio where defects (e.g., seams, voids) hardly occur, the plating film can be grown from two directions. As a result, the plating film can be grown without causing defects (e.g., seams, voids) in the concave part 13x and the through-holes 11t.

By using a titanium (Ti) film as the second conductive layer 14C (14S), satisfactory adhesiveness can be attained between the second conductive layer 14C (14s) and the first insulation layer 12 in a case where the first insulation layer 12 is formed of, for example, silicon dioxide ($SiO_2$) or silicon nitride (SiN). Therefore, unlike placing the third conductive layer 15A directly on the first insulation layer 12, no spaces will be formed in-between layers owing to the third conductive layer 15A adhered to the first insulation layer 12 via the second conductive layer 14C (14S). Accordingly, in a case of using the wiring substrate 10D for a device requiring a hermetic property (e.g., a sensor requiring air-tightness or gas-tightness), the wiring substrate 10D can provide a reliable hermetic property.

It is to be noted that, in the third embodiment, the wiring pattern may be formed only on the second surface 11b of the substrate body 11 instead of the first surface 11a of the substrate body 11. Alternatively, the wiring pattern may be formed on both the first and second surfaces 11a, 11b of the substrate body 11. Further, a multilayer wiring pattern may be formed either on the first surface 11a or the second surface 11b or both. Further, the wiring pattern may be formed on neither of the first and second surfaces 11a, 11b. In the case where the wiring pattern is formed on neither the first and second surfaces 11a, 11b, a through-wiring including the first conductive layer 13, the second conductive layer 14, and the third conductive layer 15A may be formed in the substrate body 11, so that the substrate body 11 is used as an interconnecting substrate interposed between two substrates for electrically connecting the two substrates.

For example, in a case where the wiring pattern is not formed on the first surface 11a of the substrate body 11, the second conductive layer 14C and the third conductive layer 15A need only to be formed in the through-hole 11t. In this case, an edge surface of the second conductive layer 14C and the upper surface of the conductive layer 15A may be formed substantially flush with the part of the upper surface of the first insulation layer 12 covering the first surface 11a of the substrate body 11 (same as the process illustrated in FIG. 27).

Further, the substrate body described in the first modified example of the first embodiment and the second embodiment may have trenches having a tapered cross section as the trenches described in the second modified example of the first embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A wiring substrate, comprising:
a substrate body including a first substrate surface and a second substrate surface;
a trench being open toward the first substrate surface, the trench having an inner bottom surface and an inner side surface;
a through-hole having a first end communicating with the inner bottom surface of the trench and a second end being open toward the second substrate surface;
a first conductive layer having a first surface toward the trench and being filled halfway of the through-hole from the second end;
a second conductive layer covering the first surface of the first conductive layer and covering a sidewall of the through-hole and the inner bottom surface of the trench; and
a third conductive layer covering the second conductive layer and being filled inside the trench.
2. The wiring substrate as claimed in claim 1, wherein the second conductive layer further covers an entire part of the inner bottom surface of the trench and at least a part of the inner side surface of the trench.
3. The wiring substrate as claimed in claim 2, wherein the second conductive layer covers an entire part of the inner side surface of the trench.
4. The wiring substrate as claimed in claim 1, wherein the first surface of the first conductive layer is located at a bottom of a concave that is recessed toward the second substrate surface with respect to the inner bottom surface.
5. The wiring substrate as claimed in claim 1, wherein the first conductive layer further has a second surface exposed at an opposite side of the first surface, wherein the second surface is substantially flush with the second substrate surface.
6. The wiring substrate as claimed in claim 1, wherein the trench includes an opening part, wherein a surface exposed at the opening part is substantially flush with the first substrate surface.
7. The wiring substrate as claimed in claim 1, wherein the trench has a tapered cross section.
8. A method for manufacturing a wiring substrate, comprising:
forming a trench in a substrate body having first and second substrate surfaces, the trench being open toward the first substrate surface and having an inner bottom surface and an inner side surface;

forming a through-hole having a first end communicating with the inner bottom surface of the trench and a second end being open toward the second substrate surface;

forming a metal layer on the second substrate surface;

filling a first conductive layer halfway of the through-hole from the second substrate surface by using an electroplating method with the metal layer used as a feeding layer, the first conductive layer having a first surface toward the trench;

forming a second conductive layer that covers the first surface of the first conductive layer and covers a sidewall of the through-hole and the inner bottom surface of the trench;

forming a third conductive layer that covers the second conductive layer and fills an inside of the trench by using an electroplating method with the metal layer, the first conductive layer, and the second conductive layer; and removing the metal layer.

9. The method as claimed in claim 8, wherein the forming of the second conductive layer includes forming the second conductive layer that covers an entire part of the inner bottom surface of the trench and at least a part of the inner side surface of the trench.

10. The method as claimed in claim 9, wherein the forming of the second conductive layer includes forming the second conductive layer that covers an entire part of the inner side surface of the trench.

11. The method as claimed in claim 8, wherein the filling of the first conductive layer includes filling the first conductive layer having the first surface located at a bottom of a concave, the concave being recessed toward the second substrate surface with respect to the inner bottom surface.

12. A wiring substrate, comprising:
a substrate body including first and second substrate surfaces;
a through-hole penetrating through the substrate body from the first substrate surface to the second substrate surface;
a first conductive layer having a first surface toward the first substrate surface and being filled halfway of the through-hole from the second substrate surface;
a second conductive layer covering the first surface of the first conductive layer and covering a sidewall of the through-hole and a part of the first substrate surface of the substrate body; and
a third conductive layer covering the second conductive layer.

13. The wiring substrate as claimed in claim 12, wherein the second conductive layer includes a concave part, wherein the third conductive layer is filled inside the concave part.

14. The wiring substrate as claimed in claim 12, wherein the second conductive layer covers a part of the first substrate surface, wherein the third conductive layer projects from the first substrate surface, wherein the second and third conductive layers together form a wiring pattern.

15. The wiring substrate as claimed in claim 12, wherein the first surface of the first conductive layer is located at a bottom of a concave that is recessed toward the second substrate surface with respect to the first substrate surface.

16. A method for manufacturing a wiring substrate, comprising:
forming a through-hole penetrating through a substrate body from a first substrate surface of the substrate body to a second substrate surface of the substrate body;
forming a metal layer on the second substrate surface;
forming a first conductive layer having a first surface toward the first substrate surface and filling halfway of the through-hole from the second substrate surface by using an electroplating method with the metal layer used as a feeding layer, the first conductive layer having a first surface toward the trench;
forming a second conductive layer that covers the first surface of the first conductive layer and covers a sidewall of the through-hole and a part of the first substrate surface of the substrate body;
forming a third conductive layer that covers the second conductive layer by using an electroplating method with at least the second conductive layer used as a feeding layer; and
removing the metal layer.

17. The method as claimed in claim 16, wherein the metal layer and the first conductive layer are further used as feeding layers.

18. The method as claimed in claim 16, wherein the first conductive layer is filled in the through-hole by entirely filling the through-hole with a metal layer and removing a portion of the metal layer toward the first surface by using an etching method.

* * * * *

UNITED STATES PATENT AND TRADEMARK OFFICE
CERTIFICATE OF CORRECTION

PATENT NO. : 8,446,013 B2  
APPLICATION NO. : 13/164129  
DATED : May 21, 2013  
INVENTOR(S) : Masahiro Sunohara et al.

Page 1 of 1

It is certified that error appears in the above-identified patent and that said Letters Patent is hereby corrected as shown below:

On the title page, item (75) please change the third listed inventor's name from "Hedeaki Sakaguchi" to "Hideaki Sakaguchi".

Signed and Sealed this  
Ninth Day of July, 2013

Teresa Stanek Rea  
*Acting Director of the United States Patent and Trademark Office*